US008268154B1

(12) United States Patent
Mayer et al.

(10) Patent No.: US 8,268,154 B1
(45) Date of Patent: *Sep. 18, 2012

(54) SELECTIVE ELECTROCHEMICAL ACCELERATOR REMOVAL

(75) Inventors: Steven T. Mayer, Lake Oswego, OR (US); John S. Drewery, Santa Clara, CA (US); Richard S. Hill, Atherton, CA (US); Timothy M. Archer, Lake Oswego, OR (US); Avishai Kepten, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 57 days.

This patent is subject to a terminal disclaimer.

(21) Appl. No.: 12/860,787

(22) Filed: Aug. 20, 2010

Related U.S. Application Data

(63) Continuation of application No. 11/544,957, filed on Oct. 5, 2006, now Pat. No. 7,799,200, which is a continuation-in-part of application No. 11/065,708, filed on Feb. 23, 2005, now Pat. No. 7,531,079, which is a continuation-in-part of application No. 10/739,822, filed on Dec. 17, 2003, now Pat. No. 7,449,098, which is a continuation-in-part of application No. 10/209,171, filed on Jul. 29, 2002, now Pat. No. 6,756,307, said application No. 11/544,957 is a continuation-in-part of application No. 10/947,085, filed on Sep. 21, 2004, now Pat. No. 7,449,099, which is a continuation-in-part of application No. 10/824,069, filed on Apr. 13, 2004, now Pat. No. 7,405,163, which is a continuation-in-part of application No. 10/739,822, which is a continuation-in-part of application No. 10/209,171.

(60) Provisional application No. 60/724,209, filed on Oct. 5, 2005.

(51) Int. Cl.
  C25D 5/02 (2006.01)
(52) U.S. Cl. .................................... 205/118; 205/640
(58) Field of Classification Search .................. 205/118, 205/640
See application file for complete search history.

(56) References Cited

U.S. PATENT DOCUMENTS 3,183,176 A 5/1965 Schwartz
(Continued)

FOREIGN PATENT DOCUMENTS

KR 7 704 64 10/2007
(Continued)

OTHER PUBLICATIONS

Notification of ownership transfer of certain patents owned by NuTool, Inc., 2007.

(Continued)

Primary Examiner — Nicholas A. Smith
(74) Attorney, Agent, or Firm — Weaver Austin Villeneuve & Sampson LLP

(57) ABSTRACT

Methods and apparatus are provided for planar metal plating on a workpiece having a surface with recessed regions and exposed surface regions; comprising the steps of: causing a plating accelerator to become attached to said surface including the recessed and exposed surface regions; selectively removing the plating accelerator from the exposed surface regions without performing substantial metal plating on the surface; and after removal of plating accelerator is at least partially complete, plating metal onto the surface, whereby the plating accelerator remaining attached to the surface increases the rate of metal plating in the recessed regions relative to the rate of metal plating in the exposed surface regions.

15 Claims, 14 Drawing Sheets

U.S. PATENT DOCUMENTS

| | | | |
|---|---|---|---|
| 3,313,715 A | 4/1967 | Schwartz | |
| 3,393,134 A | 7/1968 | Schwartz | |
| 3,619,383 A | 11/1971 | Eisner | |
| 3,619,384 A | 11/1971 | Eisner | |
| 3,661,752 A | 5/1972 | Capper et al. | |
| 3,749,652 A | 7/1973 | Eisner | |
| 3,751,343 A | 8/1973 | Macula et al. | |
| 3,849,270 A | 11/1974 | Takagi et al. | |
| 3,904,489 A | 9/1975 | Johnson | |
| 4,119,499 A | 10/1978 | Eidschun, Jr. | |
| 4,227,986 A | 10/1980 | Loqvist et al. | |
| 4,363,711 A | 12/1982 | Kuehnle | |
| 4,452,684 A | 6/1984 | Palnik | |
| 4,592,808 A | 6/1986 | Doubt | |
| 4,738,756 A | 4/1988 | Mseitif | |
| 5,034,753 A | 7/1991 | Weber | |
| 5,096,550 A | 3/1992 | Mayer et al. | |
| 5,158,860 A | 10/1992 | Gulla et al. | |
| 5,169,514 A | 12/1992 | Hendriks et al. | |
| 5,203,955 A | 4/1993 | Viehbeck et al. | |
| 5,256,565 A | 10/1993 | Bernhardt et al. | |
| 5,277,785 A | 1/1994 | Van Anglen | |
| 5,378,346 A | 1/1995 | Ashiru et al. | |
| 5,453,174 A | 9/1995 | Van Anglen et al. | |
| 5,462,649 A | 10/1995 | Keeney et al. | |
| 5,486,234 A | 1/1996 | Contolini et al. | |
| 5,541,567 A * | 7/1996 | Fogel et al. | 336/200 |
| 5,557,027 A | 9/1996 | Kemp | |
| 5,807,165 A | 9/1998 | Uzoh et al. | |
| 5,843,296 A | 12/1998 | Greenspan | |
| 6,056,864 A | 5/2000 | Cheung | |
| 6,056,869 A | 5/2000 | Uzoh | |
| 6,083,835 A | 7/2000 | Shue et al. | |
| 6,103,628 A | 8/2000 | Talieh | |
| 6,121,152 A | 9/2000 | Adams et al. | |
| 6,143,155 A | 11/2000 | Adams et al. | |
| 6,152,586 A | 11/2000 | Dealey, Jr. et al. | |
| 6,153,521 A | 11/2000 | Cheung et al. | |
| 6,171,467 B1 | 1/2001 | Weihs et al. | |
| 6,176,992 B1 | 1/2001 | Talieh | |
| 6,207,572 B1 | 3/2001 | Talieh et al. | |
| 6,251,235 B1 | 6/2001 | Talieh et al. | |
| 6,293,850 B1 | 9/2001 | Lin et al. | |
| 6,315,883 B1 | 11/2001 | Mayer et al. | |
| 6,328,872 B1 | 12/2001 | Talieh et al. | |
| 6,344,129 B1 | 2/2002 | Rodbell et al. | |
| 6,409,904 B1 | 6/2002 | Uzoh et al. | |
| 6,413,338 B1 | 7/2002 | DiPalma | |
| 6,447,668 B1 | 9/2002 | Wang | |
| 6,478,936 B1 | 11/2002 | Volodarsky et al. | |
| 6,482,307 B2 | 11/2002 | Ashjaee et al. | |
| 6,497,800 B1 | 12/2002 | Talieh et al. | |
| 6,527,920 B1 | 3/2003 | Mayer | |
| 6,534,116 B2 | 3/2003 | Basol | |
| 6,592,742 B2 | 7/2003 | Sun et al. | |
| 6,630,059 B1 | 10/2003 | Uzoh et al. | |
| 6,638,411 B1 | 10/2003 | Mishima et al. | |
| 6,653,226 B1 | 11/2003 | Reid | |
| 6,709,565 B2 | 3/2004 | Mayer et al. | |
| 6,755,954 B2 | 6/2004 | Mayer | |
| 6,756,307 B1 | 6/2004 | Kelly et al. | |
| 6,766,817 B2 | 7/2004 | da Silva | |
| 6,793,796 B2 | 9/2004 | Reid et al. | |
| 6,797,132 B2 | 9/2004 | Talieh et al. | |
| 6,815,354 B2 | 11/2004 | Uzoh et al. | |
| 6,852,208 B2 | 2/2005 | Ashjaee et al. | |
| 6,858,121 B2 | 2/2005 | Basol | |
| 6,863,795 B2 | 3/2005 | Teerlinck et al. | |
| 6,867,136 B2 | 3/2005 | Basol et al. | |
| 6,902,659 B2 | 6/2005 | Talieh | |
| 6,918,404 B2 | 7/2005 | Dias da Silva | |
| 6,919,010 B1 | 7/2005 | Mayer | |
| 6,921,551 B2 | 7/2005 | Basol | |
| 6,946,066 B2 | 9/2005 | Basol et al. | |
| 6,984,166 B2 | 1/2006 | Maury et al. | |
| 7,037,854 B2 | 5/2006 | Bachrach et al. | |
| 7,066,586 B2 | 6/2006 | da Silva | |
| 7,129,165 B2 | 10/2006 | Basol et al. | |
| 7,189,647 B2 | 3/2007 | Patton et al. | |
| 7,204,924 B2 | 4/2007 | Basol et al. | |
| 7,214,305 B2 | 5/2007 | Matsuda et al. | |
| 7,244,398 B2 | 7/2007 | Kotary et al. | |
| 7,282,124 B2 | 10/2007 | Talieh et al. | |
| 7,285,255 B2 | 10/2007 | Kadlee et al. | |
| 7,309,413 B2 | 12/2007 | Talieh et al. | |
| 7,311,811 B2 | 12/2007 | Talieh et al. | |
| 7,329,335 B2 | 2/2008 | Talieh et al. | |
| 7,405,163 B1 * | 7/2008 | Drewery et al. | 438/745 |
| 7,425,250 B2 | 9/2008 | Basol et al. | |
| 7,449,098 B1 * | 11/2008 | Mayer et al. | 205/118 |
| 7,449,099 B1 * | 11/2008 | Mayer et al. | 205/122 |
| 7,476,304 B2 | 1/2009 | Ashjaee et al. | |
| 7,491,308 B2 | 2/2009 | Talieh et al. | |
| 7,531,079 B1 | 5/2009 | Mayer et al. | |
| 7,578,923 B2 | 8/2009 | Basol et al. | |
| 7,799,200 B1 | 9/2010 | Mayer et al. | |
| 7,947,163 B2 * | 5/2011 | Mayer et al. | 205/667 |
| 8,158,532 B2 | 4/2012 | Mayer et al. | |
| 2001/0006224 A1 | 7/2001 | Tsuchiya et al. | |
| 2001/0013472 A1 | 8/2001 | Nakamura et al. | |
| 2002/0066673 A1 | 6/2002 | Rodbell et al. | |
| 2003/0111354 A1 | 6/2003 | Hara et al. | |
| 2003/0166382 A1 | 9/2003 | Ashjaee et al. | |
| 2004/0020520 A1 | 2/2004 | Kim et al. | |
| 2004/0040853 A1 | 3/2004 | Marsh et al. | |
| 2004/0226827 A1 | 11/2004 | Matsuda et al. | |
| 2005/0000940 A1 | 1/2005 | Iwamoto et al. | |
| 2005/0145484 A1 | 7/2005 | Basol | |
| 2005/0258046 A1 | 11/2005 | Basol | |
| 2006/0037855 A1 | 2/2006 | Hanson et al. | |
| 2006/0081477 A1 | 4/2006 | Basol | |
| 2006/0175202 A1 | 8/2006 | Mazur | |
| 2006/0260952 A1 | 11/2006 | Mazur | |
| 2007/0051619 A1 | 3/2007 | Mazur | |
| 2007/0051622 A1 | 3/2007 | Tang et al. | |
| 2007/0051639 A1 | 3/2007 | Mazur | |
| 2007/0094928 A1 | 5/2007 | Hunter | |
| 2007/0131561 A1 | 6/2007 | Wang et al. | |
| 2007/0212281 A1 | 9/2007 | Kadlee et al. | |
| 2007/0292314 A1 | 12/2007 | Effenhauser et al. | |
| 2008/0015531 A1 | 1/2008 | Hird et al. | |
| 2009/0277867 A1 | 11/2009 | Mayer et al. | |
| 2009/0280649 A1 | 11/2009 | Mayer et al. | |
| 2010/0029088 A1 | 2/2010 | Mayer et al. | |

FOREIGN PATENT DOCUMENTS

| | | |
|---|---|---|
| TW | 1 329 893 | 12/2002 |
| TW | 1 733 80 | 3/2003 |
| WO | 03098676 A1 | 11/2003 |

OTHER PUBLICATIONS

Final Office Action mailed Oct. 20, 2010 for U.S. Appl. No. 11/602,128.

Silva, "Applied Hydrology to Fluidic Devices", email message received May 11, 2010, 7 pgs.

U.S. Office Action for Appl. No. 11/890,790 mailed Dec. 27, 2010.

U.S. Final Office Action for U.S. Appl. No. 11/888,318 mailed Feb. 3, 2011.

Notice of Allowance mailed May 11, 2011 and Allowed Claims for U.S. Appl. No. 11/602,128.

U.S. Final Office Action for U.S. Appl. No. 11/890,790 mailed Jun. 10, 2011.

Mayer et al., "Modulated Metal Removal Using Localized Wet Etching" Novellus Systems, Inc., U.S. Appl. No. 12/462,424 filed Aug. 4, 2009.

U.S. Office Action for U.S. Appl. No. 10/739,822 mailed May 17, 2007.

U.S. Final Office Action for U.S. Appl. No. 10/739,822 mailed Nov. 27, 2007.

Mayer et al., "Method for Planar Electroplating", Novellus Systems, Inc., U.S. Appl. No. 11/888,318, filed Jul. 30, 2007.

U.S. Appl. No. 10/302,213, filed Nov. 22, 2002.

U.S. Appl. No. 11/736,534, filed Apr. 17, 2007.

U.S. Office Action, mailed Nov. 20, 2007 for U.S. Appl. No. 10/824,069.

Contolini, et al., "Electrochemical Planarization for Multilevel Metallization", Lawrence Livermore National Laboratory, J. Electrochem Soc., vol. 141, No. 9, Sep. 1994, pp. 2502-2510.

Sato, et al., "Newly Developed Electro-Chemical Polishing Process of Copper as Replacement of CMP Suitable for Damascene Copper Inlaid in Fragile Low-k Dielectrics", Advanced Process R & D Laboratories, LSI Technology Development, Semiconductor Network Company, Sony Corporation, IEDM Meeting, Dec. 2-5, 2001, pp. 1-4.

Tsai, et al., "CMP-Free CMP-Less Approached for Multilevel Cu/low-k BEOL Integration", Taiwan Semiconductor Manufacturing Company, No. 9, IEDM Meeting, Dec. 2-5, 2001, pp. 1-4.

Mayer, et al., "Method and Apparatus for Uniform Electropolishing of Damascene IC Structures by Selective Agitation", Novellus Systems, Inc., U.S. Appl. No. 09/967,075, filed Sep. 28, 2001, pp. 1-50.

Osterwald et al., "New Theoretical Ideas about the Action of Bath Additives During Cathodic Deposition", Galvanotechnik, vol. 66 (1975), No. 5, pp. 360-365.

Eisner, S., "Electroplating Accompanied by Controlled Abrasion of the Plate", Oct. 1971, pp. 993-996.

Osterwald, Jorg, "Leveling and Roughening by Inhibitors and Catalyst", Institute for Metallurgy of the Technical University of Berlin, vol. 17, No. 5, 1976, pp. 89-94.

Patton et al., "Sequential Station Tool for Wet Processing of Semiconductor Wafers", Novellus Systems, Inc., U.S. Appl. No. 10/693,223, filed Oct. 24, 2003, pp. 1-32.

U.S. Appl. No. 10/824,069, filed on Apr. 13, 2004.

Notice of Allowance, mailed May 15, 2008 for U.S. Appl. No. 10/824,069.

U.S. Appl. No. 11/544,957.

U.S. Appl. No. 11/893,374.

Notice of Allowance, mailed Jul. 10, 2008 for U.S. Appl. No. 10/739,822 Patent 7,449,098.

Office Action, mailed Dec. 12, 2007 for U.S. Appl. No. 11/065,708.

Office Action, mailed Jun. 13, 2008 for U.S. Appl. No. 11/065,708.

Final Office Action mailed Nov. 12, 2008 for U.S. Appl. No. 11/065,708.

Notice of Allowance, mailed Mar. 3, 2009 for U.S. Appl. No. 11/065,708.

Notice of Allowance, mailed May 20, 2010 for U.S. Appl. No. 11/544,957.

Office Action, mailed Jul. 9, 2010, for U.S. Appl. No. 11/888,318.

Notice of Allowance mailed Dec. 16, 2011 issued in U.S. Appl. No. 11/602,128.

U.S. Office Action mailed Apr. 26, 2012 issued in U.S. Appl. No. 12/462,424.

* cited by examiner

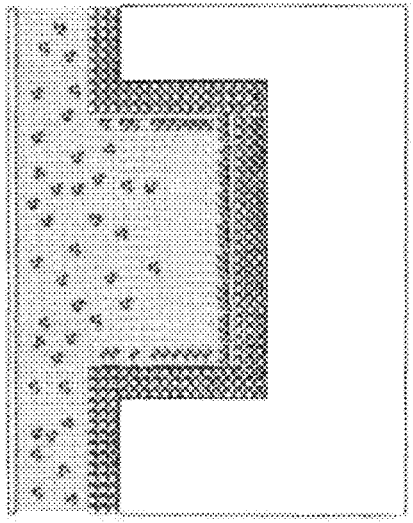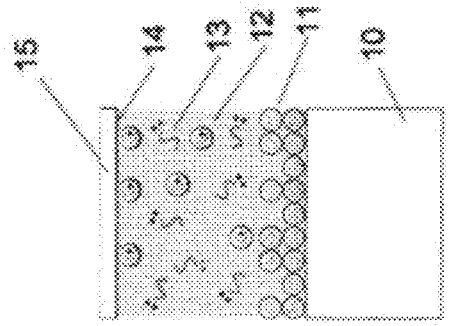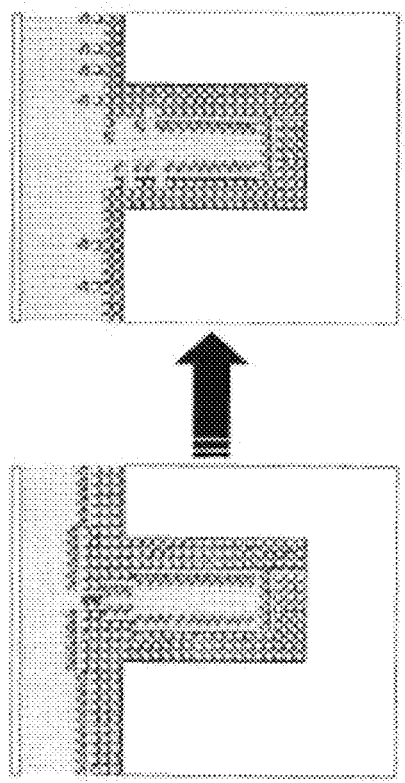

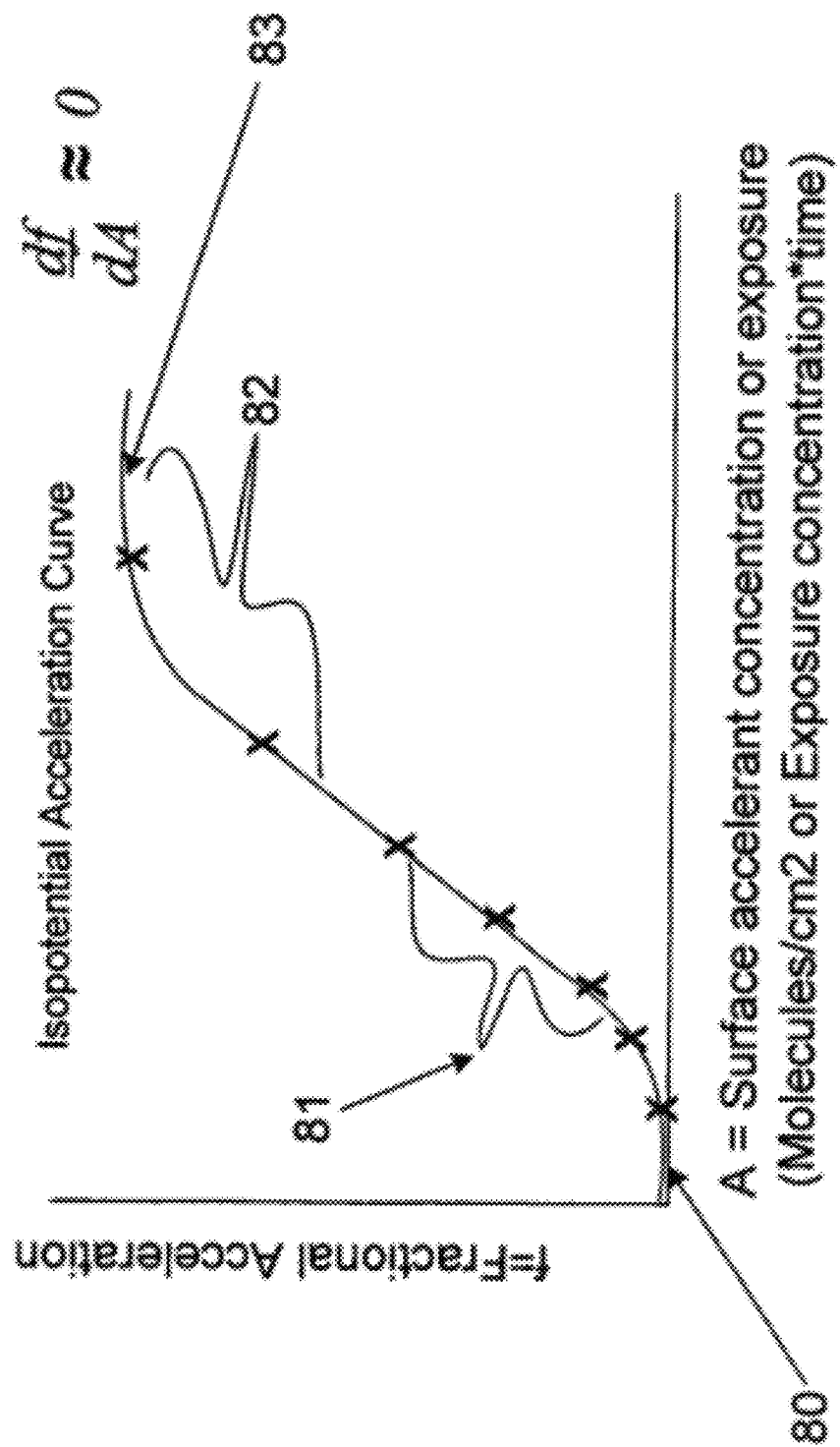

us 8,268,154 B1

SELECTIVE ELECTROCHEMICAL ACCELERATOR REMOVAL

CROSS-REFERENCE TO RELATED APPLICATIONS

This application is a continuation of U.S. patent application Ser. No. 11/544,957, filed Oct. 5, 2006, now U.S. Pat. No. 7,799,200, which is a continuation-in-part of U.S. patent application Ser. No. 11/065,708, filed Feb. 23, 2005, now U.S. Pat. No. 7,531,079, issued May 12, 2009, which is a continuation-in-part of U.S. patent application Ser. No. 10/739,822, filed Dec. 17, 2003, now U.S. Pat. No. 7,449,098, issued Nov. 11, 2008, which is a continuation-in-part of U.S. patent application Ser. No. 10/209,171, filed Jul. 29, 2002, now U.S. Pat. No. 6,756,307, issued Jun. 29, 2004. Each of these applications is incorporated herein by reference in its entirety and for all purposes.

U.S. patent application Ser. No. 11/544,957 also claims benefit of U.S. Provisional Patent Application Ser. No. 60/724,209, filed Oct. 5, 2005, which is incorporated by reference in its entirety and for all purposes.

U.S. patent application Ser. No. 11/544,957 is also a continuation-in-part of U.S. patent application Ser. No. 10/947,085, filed Sep. 21, 2004, now U.S. Pat. No. 7,449,099, issued Nov. 11, 2008, which is a continuation-in-part of U.S. patent application Ser. No. 10/824,069, filed Apr. 13, 2004, now U.S. Pat. No. 7,405,163, issued Jul. 29, 2008, which is a continuation-in-part of U.S. patent application Ser. No. 10/739,822, filed Dec. 17, 2003, now U.S. Pat. No. 7,449,098, issued Nov. 11, 2008, which is a continuation-in-part of U.S. patent application Ser. No. 10/209,171, filed Jul. 29, 2002, now U.S. Pat. No. 6,756,307, issued Jun. 29, 2004.

Each of the applications and patents listed in this section is incorporated herein by reference in its entirety and for all purposes.

BACKGROUND

A principal objective of damascene circuit interconnect manufacture is to create metal isolated by and embedded in a dielectric media. Modern copper electroplating for damascene processes proceeds by a "bottom up" fill mechanism that preferentially fills high aspect ratio features such as deep trenches and vias on a wafer surface. The preferential filling of recessed requires careful control of process conditions. Mayer et al., U.S. Pat. No. 6,946,065 entitled "Process for Electroplating Metal into Microscopic Recess Features", incorporated herein its entirety for all purposes, describe some of the issues one must consider in performing filling operations. For the most part, prior processes do not preferentially fill and planarize low aspect ratio features and therefore they require significant excess metal deposition ("overburden"). Overburden is the additional copper deposited on the substrate to ensure that all low aspect ratio features are completely filled (essentially in an isotropic fashion) to the plane of the wafer isolating dielectric surface (the "field"). Since the preferential "bottom-up fill" does not occur in low aspect ratio features, the surface of the overburden typically follows the contours of these underlying wafer surface recesses over these features. In most cases, the overburden on field regions is slightly thicker than the thickness of the damascene layer, typically on the order of 1.2 or more times the depth of the deepest feature. For example, a damascene structure that has 0.5 micrometers deep features will typically require an overburden of at least approximately 0.7 to 0.8 micrometers.

The fact that the filling of low aspect ratio features is largely isotropic leads to very little, if any, reduction in the overall topography of the surface. The step change in the low aspect ratio features is essentially identical to the initial patterned recess depth in the dielectric media. When combined with overplating or momentum plating associated with high aspect ratio feature, the net topography variation using current technology generally increases during the plating operation, and is approximately equal to the sum of the step height of the dielectric film thickness and the highest overplated high aspect ratio feature. A goal of the manufacturing steps is to eventually isolate the individual lines within the recesses of the device dielectric layer. However if metal was subsequently isotropically removed, then these low aspect ratio features would lose all the metal below the plane of the dielectric before the high aspect ratio lines and field area metal was removed. A planarization or polishing technology that removes metal more rapidly from raised regions than recessed region is therefore used so that, at the end of the metal removal steps metal remains in these low aspect ratio features. Chemical mechanical polishing is one technology that is used to accomplish this end. But to use these polishing planarizing technologies, "overburden" is required. An desirable alternative would be to employ a process where the metal in recessed features is deposited more rapidly than other areas.

Overburden is undesirable for a number of reasons. It requires deposition of excess copper that is essentially wasted. It requires an extra step of removing the overburden material. Thus, overburden represents additional materials costs (excess copper deposited and removed) as well as decreased throughput/productivity. Overburden is typically removed by a planarization technique such as chemical mechanical polishing (CMP), electrochemical chemical polishing (eCMP) or other electropolishing techniques suited to planarize low aspect ratio features. The CMP and eCMP processes are particularly expensive process and implement generally corrosive chemical and slurry formulations on large pads to polish the surface of the integrated circuit. Polishing can be difficult to control and the polishing end-point can be difficult to detect. The high equipment cost, waste handling cost, and low throughput contribute to the overall expense of CMP and eCMP. Also, with the introduction of porous low-k dielectrics in semiconductor devices, modification of traditional CMP and even eCMP processes will be required, as current methods can lead to cracking and/or delamination of low-k materials which are fragile and typically have a very low compression strength.

Measures must be taken to avoid metal "dishing", dielectric/line "erosion", and underlying topography during CMP. See, for example, "Establishing the discipline of physics-based CMP modeling, S. R. Runnels, and T. Lauren, *Solid State Technology*, March, 2002. Dishing occurs on the interconnect metal primarily over larger features and contact pad region during the later stages of copper CMP. Because electroplating creates variations in thickness over the dielectric, and because underlying topography is transferred to higher levels through the dielectric from lower levels, within-die variations in the amount of metal thickness over the dielectric continue to always exist and persist up to the point of the first clearing of interconnect metal over the damascene structure (barrier exposure). Because neither the metal deposition (e.g., electroplating) nor metal removal (e.g., CMP) processes are perfectly uniform across the wafer surface, global non-uniformities also exist. Dishing of a feature generally occurs when the metal has cleared locally around the periphery of the feature but the polishing process must be is continued over that feature to complete the process elsewhere. This "over-polishing' is needed, for example, because other areas of the surface have not reached the clearing endpoint. The pad tends to terminate and is "held up" at the feature periphery by the barrier film (supported by the underlying dielectric). The barrier material is largely unaffected (i.e., removed at a much slower rate) as the CMP of copper on the surface continues. The problem arises that the interconnect metal (e.g., copper) in the feature is slowly removed, preferentially within the feature, hence it becomes "dished". It is believed desirable to ensure that all the interconnect metal (copper) above the barrier/dielectric level is removed from the top of the barrier/dielectric at this point in the process before proceeding with removing the typically conductive barrier film, so significant "overpolishing" is often needed and significant dishing can occur. After interconnect (copper) removal above the field is complete, the barrier layer is exposed. If properly performed, the barrier is largely unaffected by this process. During the subsequent barrier/dielectric step of the CMP process, one needs to avoid excessive erosion. Erosion arises from locally varying polishing property of different area of the surface. This is believed due to the different CMP rates and mechanical "strength" of the substrate at different point on the circuit. Varying feature density and the different mechanical properties of the metal and dielectric are the leading causes of polishing erosion. In the barrier/dielectric removal/polish CMP steps erosion can be viewed as primarily a mechanically driven process. Most topography has been removed at this stage. After the barrier has been removed and the dielectric is exposed, a goal of polishing is to eliminate dishing in the early copper CMP step without causing erosion of high-density area of lines. To eliminate the dishing, some amount of dielectric is removed but this reduces the thickness of the copper interconnects and increases the electrical resistance. The overall changes in the planarity caused by dishing, erosion, and underlying topography can also lead to difficulties in obtaining good focus across the die during subsequent lithographic steps. Also important, topography introduced by these effects is replicated at the next metal level, creating "underlying topography". These areas are particularly troublesome for CMP technology because of the competing requirements of having planarization and compliance. Clearing metal by CMP from recessed areas of "underlying topography is difficult, often leaving "puddles" of metal. To remove these "puddles," the CMP process is generally continued for a longer period of time than otherwise desirable because it can create excessive dishing.

While not intending to be held to any specific theoretical explanation, this background helps to explain the interrelationship between the types of planarization phenomena often encountered (dishing, erosion, puddles) and illustrates the problems of the current art. These issues make CMP progressively more difficult with advancing technology requiring additional numbers of metal layers to be added to the structure.

Alternatives to CMP include electrolytic etching techniques such as electropolishing or electroless etching. Compared to CMP, these are relatively low cost techniques. They also provide much higher processing rates. Electropolishing is a method of polishing metal surfaces by applying an electric current through an electrolytic bath, and removing metal via electrolytic dissolution, the reverse of electroplating.

Although many previous approaches address the need for simpler and improved electroplanarization in semiconductor device fabrication, they generally address alternative planarization techniques performed after deposition of an undesirably thick overburden with substantial variations topography. Yet electroplating processes that deposit copper with reduced overburden, reduce and/or control the variation of topography, or improve planarity, are highly desirable.

J. Osterwald and J. Schulz-Harder ("New Theoretical Ideas about the Action of Bath additives", *Galvanotechnik,* 66, 360, [1975] and "Leveling and Roughening by Inhibitors and Catalysts", *Oberflache-Surface,* 17, 89, [1976]) proposed a smoothing and filling mechanism and action of a strongly surface-attached accelerating molecule that enables preferential growth. Others demonstrated the usefulness of this concept in interpreting, modeling and controlling preferential filling of small damascene features. See, for example, J. Reid and S. Mayer, in *Advance Metalization Conference Proceedings,* 1999, pg 53; A. C. West, S. Mayer, and J. Reid, *Electrochem. Solid-State Lett.,* 4, C50, [2001]; T. P. Moffat, D. Wheeler, W. H. Huber, and D. Josell, *Electrochem Solid State Lett,* 4, C26, [2001]; and T. P. Moffat, D. Wheeler, and D. Josell, *Electrochemical Society Interface,* pg 46, Winter 2004.

Another class of methods useful in overburden reduction and planarization is referred to as "brush plating" or "planar plating". These methods generally employ a brush that acts on the surface to achieve smoother deposits during the plating process. So-called bottom-up fill (also referred to as "superfilling") methods are now commonly used to fill high aspect ratio (i.e., deeper than wide) recess features, though a geometric acceleration concentration mechanism similar to that proposed by Ostwald et. al. and later made practical. However, the physical and geometrical limitations of these processes, mean that they are not capable of filling low aspect ratio features Since both high and low aspect ratio features can exist on every damascene integrated circuit interconnect level, there is interest in any potentially low cost "planar plating" method. Various planar plating methods that attempt to modify the otherwise conformal plating behavior over recessed low aspect ratio region by modifying the plating method (bath additives, transport properties, field effects, etc.) have been reported.

Schwartz (U.S. Pat. Nos. 3,183,176, 3,313,715 and 3,939, 134) describes a method and apparatus for brush planar electroplating for preparing smooth electrodeposits, diminishing surface roughness and preferentially filling recessed small crevices. Macula et al. (U.S. Pat. No. 3,751,343) also describe a brush plating apparatus and process where electrolyte is held in and simultaneously moves through a rubbing surface element with electrolytic plating with an orbital rubbing like motion. Eisner (U.S. Pat. Nos. 3,619,383 and 3,749,652) describes an apparatus and method of brush plating which uses simultaneous abrasion of the surface to reduce roughness and accumulation of unwanted metal deposition.

The following documents are incorporated herein by reference in their entireties and for all purposes: Controlini and Mayer (U.S. Pat. No. 5,486,234); Controlini and Mayer (U.S. Pat. No. 6,315,883); Controlini et al. (U.S. Pat. No. 6,709, 565); Koos et al., U.S. patent application Ser. No. 10/690,084, entitled "Method for Fabrication of Semiconductor Interconnect Structures with Reduce Capacitance, Leakage Current and Improved Breakdown Voltage, filed Oct. 20, 2003; U.S. Pat. No. 6,176,992; Reid (U.S. Pat. No. 6,024,857); Bulent et al. (U.S. Pat. No. 6,534,116); U.S. patent application Ser. No. 11/739,822; Reid (U.S. Pat. No. 6,653,226); and International Patent Application No. WO 2005/042810 entitled "Membrane Mediated Electropolishing" in the names of Mazur et al.

SUMMARY OF THE DISCLOSURE

Aspects of the present invention relate to methods of preferentially filling by electroplating features that are recessed from the general plane of a workpiece. Aspects of the invention relate to 1) a process for improving the filling high aspect ratio (features deeper than wide) recess features, 2) the reduction of excess electroplating thickness commonly observed during copper electrodeposition over high aspect ratio feature (a "mound" or "bump" or excessive metal often found after filling high aspect ratio features, sometimes called "momentum" or "overplating"), and 3) the preferential filling with metal (referred to hereafter as "bottom-up" filling or selective accelerated plating) in recessed area of a surface of low aspect ratio damascene features (features much wider than deep). The invention is thus applicable, for example, to the manufacture of integrated circuit or other electronic devices. Aspects of the invention further relate to hardware for performing and controlling these processes, reducing the extent of overplating, providing selective accelerated plating and preferentially filling high and low aspect ratio damascene features. In addition, the invention relates to removal of excess metal, specifically the metal from the general planar surface of a workpiece. In certain embodiments, each of these deposition and removal steps occurs primarily though electrochemical action rather than, for example, physical abrasion, sputtering, etc. In some embodiments these steps are performed with little or no physical contact with the surface of the workpiece under construction at any time. In some cases it has been found useful to continue the feature filling process beyond the simple filling of the recesses to a point were raised, inverted, or "embossed" regions are created over underlying features. The protecting of the underlying structure with excess metal can reduce undercutting, dishing, and erosion as well as the potential adverse impact on the underlying topography caused by subsequent device level manufacture and the dielectric planarization steps (e.g., barrier/dielectric CMP). In such instances to later remove the overfill, additional removal process sequences may be used, such as a non-contacting wet etch (such as an isotropic wet etch) or membrane mediated electropolishing.

One aspect of the invention pertains to methods of metal deposition characterized by the following sequence of operations: (a) causing a deposition accelerator to become attached to a work piece surface including both recessed and exposed surface regions of the surface; (b) selectively electrochemically removing the deposition accelerator from the exposed surface regions without performing substantial metal deposition on the surface; and (c) after (b) is at least partially complete, depositing metal onto said surface. In such methods the deposition accelerator remaining attached to the surface increases the rate of metal deposition in the recessed regions relative to the rate of metal plating in the exposed surface regions. In certain embodiments, the selective electrochemical removal is accomplished by bringing the surface into close proximity with an electric field-imposing member such that the accelerator is selectively removed from the exposed surface regions in close proximity with the member and that accelerator more remote from the member in said recessed regions remains attached. In certain embodiments, the deposition accelerator is an electroplating accelerator. In certain embodiments, operation (b) is performed without substantial contact with said surface.

Various operations may be performed before removing the deposition accelerator in (b). Examples of such operations include (1) plating metal unto said surface to fill at least some of said recessed regions, (2) exposing said surface to an oxide-removing solution.

After operation (b) and prior to operation (c), the method may include cleaning said surface to remove contaminants and/or debris. Such cleaning may be performed with a cleaning solution. Further, the cleaning may be aided by brushing or megasonic energy.

Another aspect of the invention pertains to methods of removing accumulated metal forming a constriction at the opening of a recessed region at the surface of a work piece. Such methods may be characterized by the following operations: (a) providing a work piece having a surface with exposed surface regions and recessed regions, wherein at least some of said recessed regions are characterized by having said constrictions of accumulated metal; and (b) selectively removing metal constriction while said work piece is electrically polarized without performing substantial metal plating on said surface by bringing said surface into close proximity with an electric field-imposing member.

Such methods may also include an additional operation, prior to operation (b), of causing a deposition accelerator to become attached to the surface including the recessed and exposed surface regions. Then, in operation (b), the selective removal of constriction metal may also remove the deposition accelerator from the exposed surface regions while said work piece is electrically polarized. In certain embodiments, the method may also include, after operation (b) is at least partially complete, plating metal onto said surface, whereby the deposition accelerator remaining attached to the surface increases the rate of metal plating in said recessed regions relative to the rate of metal plating in the exposed surface regions. Examples of deposition accelerators include the following: 2-mercaptoethane-sulfonic acid (MESA), 3-mercapto-2-propane sulfonic acid (MPSA), dimercaptoproionyl-sulfonic acid (DMPSA), dimercaptoethane sulfonic acid (DMESA), 3-mercaptopropionic acid, mercaptopyruvate, 3-mercapto-2-butanol, and 1-thioglycerol.

Many of the methods described herein are particularly useful when applied to work pieces having at least some of said recessed regions with aspect ratios of less than one. Further, the invention is preferably used with work pieces that are partially fabricated integrated circuits, such as work pieces in which the recessed regions include trenches and/or vias.

The electric field-imposing member of the apparatus may comprise a flat electrode, a metallic film or a porous material. The metallic film may be supported by an flexible substrate. The support may have elastic properties. The support may be made of, for example, a polymer or a metal. The electric field-imposing member may comprise a membrane, particularly one made of an ion-conducting polymer such as a cationic or anionic membrane.

The electric field-imposing member is usefully brought into close proximity with the surface, by scanning portions of the surface with the member. The member may be separated from the surface by a film of gas, liquid, or electrolyte. In some embodiments there may be continuous or intermittent contact between the surface and electric field-imposing member.

Another aspect of the invention pertains to apparatus for selectively removing chemical agents attached to, adhered to and/or adsorbed to the surface of a planar work piece characterized by recessed regions on said surface. The apparatus may be characterized by the following features: (a) an elongated member defining the upper and partial side walls of a chamber; (b) an electric field-imposing member defining the lower wall and partial side walls of the chamber; (c) an electrode for contacting electrolyte within the chamber; and (d) at least one contact arm for maintaining electrical contact between the electrode and an exterior circuit while said apparatus is moveably mounted on a base.

In certain embodiments, the apparatus also includes a ballast vessel for relieving exterior pressure imparted on said member to the electrolyte in the chamber and a passage communicating between said electrolyte in said chamber and said ballast vessel. The electric field-imposing member may include features as set forth above and elsewhere herein.

These and other features and advantages of the invention will be described below in more detail with reference to the associated drawings.

BRIEF DESCRIPTION OF THE FIGURES

FIGS. 3a-3d are schematic diagrams of how metal is deposited with an accelerator within and around surface features.

FIG. 11 is a graph of the expected relationship between accelerator dosing and current density for a particular set of deposition conditions.

DESCRIPTION OF EMBODIMENTS

Figure 1:
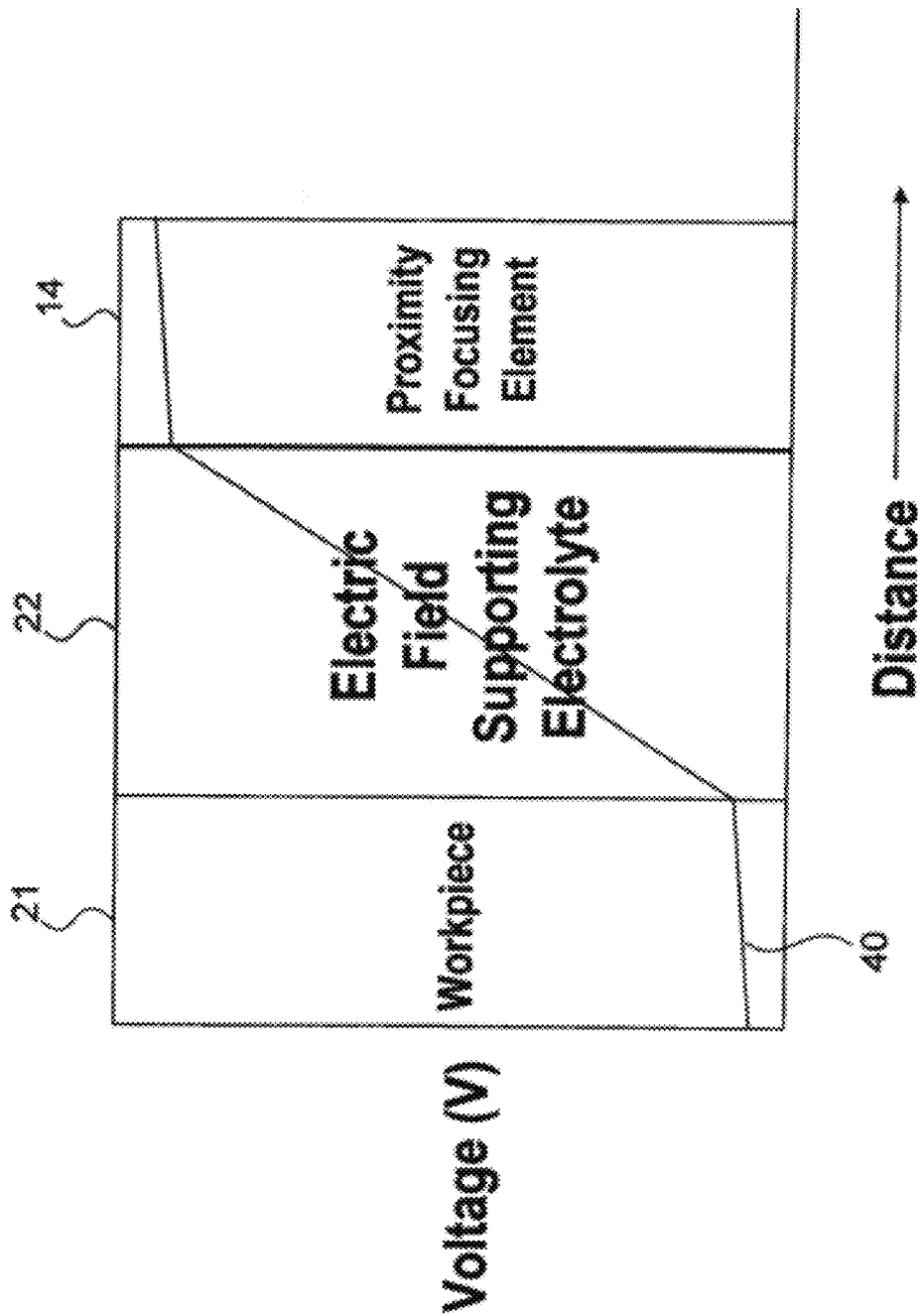
FIG. 1 is a graph showing the typical voltage vs. displacement characteristics across the interface from the workpiece, through the electric field supporting electrolyte and the proximity focusing element.

The invention is directed to a novel plating approach, termed Selective Electrochemical Accelerator Removal (SEAR). The SEAR process involves the steps of causing an activating, metal-deposition-accelerating chemical called (also called an "accelerant" or "accelerator") a deposition (preferably an electroplating) accelerator to become attached to a surface of a workpiece including recessed and exposed surface regions; selectively removing the deposition accelerator from the exposed surface regions by imposing an strong electric field in the vicinity of the substrates surface without simultaneously performing substantial metal deposition (e.g. plating) on the surface; and after removal of the accelerator is at least partially complete, depositing metal onto the surface by metal deposition (for example, electrodeposition, electroless deposition, CVD, PECVD, etc.) to lead to preferential deposition of metal in the areas where the plating accelerator remains (i.e. in the recessed regions). The accelerator remaining attached to the surface increases the rate of metal deposition in the recessed regions relative to the rate of metal deposition in the exposed surface regions. An electric field imposing electrode is brought in close proximity to the surface and, due to its proximity, causes the removal, destruction, or otherwise "deactivation" of the accelerator from the surface. In a particular embodiment, the process may involve creating a surface wherein an electroplating sensitive accelerator, generally a plating "accelerating" or depolarizing compound, is reacted with, or otherwise becomes attached to the surface, and the accelerator is then preferentially removed from raised (non-recessed) regions. Then electrodeposition is performed under appropriate conditions for the particular accelerator chosen (such as bath components and operating conditions).

The present invention is advantageous over known methods of planarizing a workpiece such as a silicon wafer. Pads and brushes that are used to make physical contact with a wafer (e.g., with a pad as in CMP, ECMP, Planar Plating, Electroplanarization and SAP) can lead to a number of undesirable defects including damage to underlying low-K materials. While MMEP, and MMEP with an array of electrodes, may be useful in avoiding physical contact to the wafer, it still planarizes though metal removal (requiring overburden) and may suffer from a limited ability to planarize a surface topography due to the operating physics (e.g., as the topography decreases, the "ohmic difference" mechanism and hence the rate of topography reduction decreases), potentially limited compliance lengths of the membrane that is used, and feature edge attack whereby edges are subject to high removal rate due to field focusing there.

Therefore, the highly selective and often substantially non-contacting method according to the present invention for reducing and controlling topography during deposition that can be combined with non-contact methods of removal of metal (isotropic surface kinetic controlled dry or wet chemical etching) provides advantages over the prior art. The invention is further advantageous since it does not introduce a new set of problems. The invention is useful, for example, in that it facilitates an electroplating process sequence that 1) is simple and cost effective, 2) creates no new source of defects, 3) fills features of all aspect ratios with little, if any, overburden, 4) protects the underlying structures from dishing or metal loss during metal removal, 5) does not physically stress or contact the surface, and 6) mitigates other problems associated with CMP processing such as erosion and damage to underlying topography.

The method and apparatus disclosed herein solve the problems raised above. Furthermore, the method and apparatus disclosed herein solve the problem of highly variable and difficult-to-control topography commonly found as a result of damascene copper electroplating processes. More specifically, it enables the "bottom-up" filling of features of all aspect ratios with minimal overburden, enabling controlled (i.e. reduction or tailoring) topography (e.g., planar or "embossing" the surface over underlying features) without physical abrading or rubbing contact to the wafer, (e.g., without resorting to the use of a pad or similar type of friction/abrading/rubbing element). The invention is particularly useful in combination with various non-contacting metal removal techniques, such as isotropic wet etch, electropolishing and membrane mediated electropolishing. The invention also is useful in simplifying, eliminating or improving the results from chemical mechanical polishing operations, e.g., elimination of copper chemical metal planarization steps and improved dishing and erosion from barrier/dielectric removal steps.

In a typical embodiment, the process of selectively attaching an activating or accelerating plating additive (e.g., plating accelerator) is performed in two parts: 1) adsorbing the accelerator onto the workpiece surface and 2) selectively removing the adsorbed accelerator from the exposed or raised "field" regions. Often the step of adsorbing the accelerator is preferably substantially uniformly performed over the entire surface of the workpiece, including recesses. In preferred cases the removal is accomplished without substantially touching or abrading the surface. In the Selective Electrochemical Accelerator Removal (SEAR) process, the selective removal of the accelerator is accomplished via an electrochemical operation (e.g., a localized sputtering electrochemical oxidation or reduction of the raised region of the surface) or a process that is facilitated by the formation of chemicals created by an electrochemical process. Other non-electrochemical methods of selective removal may be operable, but less preferred. Also, other non-contacting methods for selective accelerator removal may be operable, such as for example, the use of a very rapid pulse of heat emanating from a heated head that passes quickly over the surface and can alter, decompose, or otherwise cause the desorption of accelerator from regions of a raised surface. The preferred method of removing the accelerator utilizes a electrochemical techniques and apparatus, which are simpler to enable and have added benefits of better selectivity and control.

Application of the Plating Accelerator

The use of plating accelerators is known in the art. They are typically applied to the workpiece surface by simple contact by spraying or immersion. In many cases, the presence of the accelerator does not substantially interfere with the kinetics of the overall charge transfer process yet can radically modify the deposition behavior when certain other plating bath additives (e.g. suppressors, halide ions) are present. As described in U.S. application Ser. No. 10/739,992, there are a number of ways to achieve global activation of a metal surface.

The surface can be sprayed with a solution containing the accelerator, deposited by vapor deposition, condensation, sublimation, chemical vapor deposition, or any number of other suitable means as would be obvious to those skilled in the art. Examples of suitable activating additives include mercapto-group containing molecules such as 2-mercaptoethane-sulfonic acid (MESA), 3-mercapto-1-propane sulfonic acid (MPSA), dimercaptoproionylsulfonic acid (DMPSA), dimercaptoethane sulfonic acid (DMESA), 3-mercaptopropionic acid, mercaptopyruvate, 3-mercapto-2-butanol, and 1-thioglycerol. These and similar accelerators have been found to strongly adsorb to a work piece surface such as copper metal but do not substantially interfere with the overall charge transfer process of electroplating, particularly in acidic baths containing low levels of halides. The plating accelerator will be globally applied to the surface of the workpiece, including the exposed planer surface as well as both high aspect and low aspect ratio recesses such as trenches and vias.

Elements of the Apparatus for Selectively Removing Plating Accelerator

In general, when the Electric-Field-Imposing Element (EFIE) that contains a Proximity Focusing Interface (PFI) is brought in close proximity to the workpiece and a large potential is applied between the workpiece and the PFI, the selective removal, destruction, or conversion of the accelerator to an inactive form is selectively achieve. For example, to selectively and preferentially remove the plating accelerator, the method of the invention (SEAR) employs an Electric-Field-Imposing-Element (EFIE) that contains a Proximity-Focusing Interface (PFI) that is brought very close to the workpiece, the proximity being similar to and of the same order or scale of the topography present on the workpiece surface. In some cases the some or all portions of the PFI may be brought in contact (intermittently or continuously) with the workpiece surface, which can allows the PFI to register its distance from the exposed regions of the workpiece surface. The EFIE/PFI hardware has the properties of being capable of creating, imposing or causing to induce a spatially selective electrochemical reaction at the workpiece surface. The electrochemical reaction or reactions associated with EFIE occur preferentially at locations physically closer to the EFIE focusing interface than at locations further away from the EFIE focusing interface. Referring to FIG. 1, the electrochemical reaction associated with the EFIE and occurring at the workpiece surface is induced by the proximity and nearly constant potential of the PFI surface that is typically transmitted though a very high resistance electrolyte 22. The term electrolyte is somewhat different that typically used, because electrolyte often implies dissolved disassociate paired ion of significant conductivity. The electrolyte in this invention is a resistive fluid which often has very few, if any, paired ions able to carry current in the absence of the imposed high electric field between the workpiece and the PFI. The PFI however can cause the high resistance electrolyte to break down and generate charge carriers by decomposition of the fluid at the workpiece surface. These charge carries may be unpaired within a space charge containment region between the PFI and the workpiece, as in a plasma. This very high resistance electrolyte 22 is interposed between the workpiece 21 and the PFI 14. This high resistance electrolyte is referred to as the Electric-Field-Supporting-Electrolyte (EFSE). The EFSE can also serve the purpose of forming a hydrodynamic fluid interface between the workpiece and PFI so that there is no direct contact of the PFI with the workpiece and providing lubricity to the workpiece surface as the EFI traverse or is otherwise transported over the surface. The spatially selective removal, modification, destruction or other mean of "deactivation" of the accelerator is selectively achieved over the surface by the spatially specific action of the EFIE proximity focusing interface combined with the high resistivity EFSE. The EFIE proximity focusing interface, when combined with the highly resistive EFSE, is substantially an equipotential surface on the scale at least as large as features of the workpiece features and EFIE/workpiece spacing. When brought very close to the surface, electrochemical reactions are facilitated to occur preferentially in workpiece areas closest to the EFIE proximity-focusing surface (PFI), and occur at significantly slower rates or not at all at regions further away from the interface.

Figure 2:
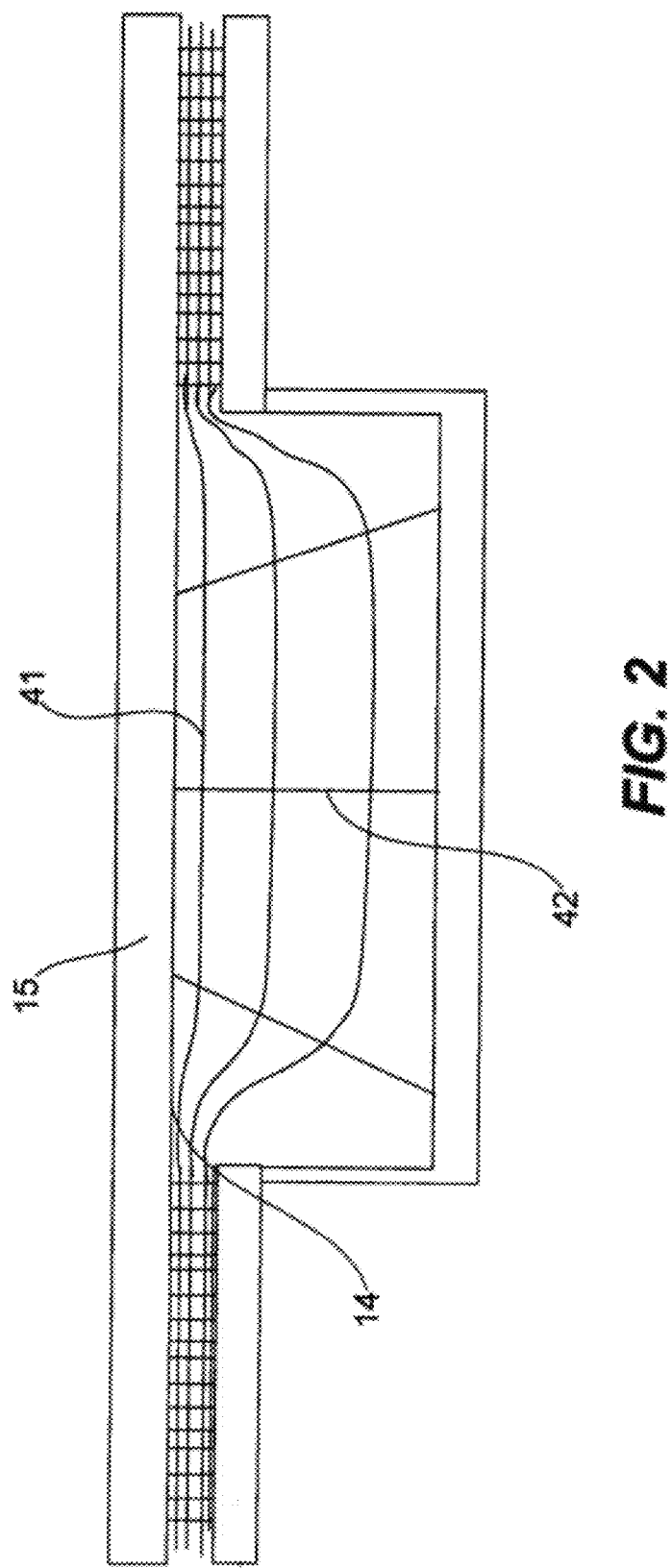
FIG. 2 is a schematic drawing of the lines of current and voltage contours at the planar surface and within a recess of a workpiece.

By employing a power supply to impose a voltage between the terminal leads of the workpiece and the EFIE (either directly or indirectly to the EFIE proximity focusing element), and because the conductivity of the metal on the workpiece and the system resistance to the EFIE proximity focusing elements surface are much smaller than that across the EFSE, a large electric field is created within and across the EFSE. Hence, a large field can be created over a very small distance and in the vicinity of the workpiece surface. Referring to FIG. 1, the voltage 40 also varies in strength primarily in the direction of the vector drawn between the workpiece surface and the PFI. Referring to FIG. 2, current (vertical lines 42) passes in a direction substantially perpendicular to the gradient in voltage (horizontal lines 41). The field strength diminishes as the separation between the elements changes and hence electrochemical reaction rates vary depending on the depth or local separation between the PFI and the workpiece. In some cases, a series of modification of the metal surface occurs as a result of the imposed electric fields and these modifications result in significantly different rate of reaction beyond those expected by similar ohmic considerations. For example, when using deionized water as a EFSE with a copper surface, copper may be oxidized at both raise and recessed regions. A parallel reaction of the oxidation of water to form protons (acid) and oxygen, which will occur preferentially at the exposed surface, can react with the metal oxide, changing the pH locally and dissolve the metal oxide. This selective removal of oxide may results in a significantly increased rate of removal of metal (a non-linear behavior) and facility the selective removal of any accelerant attached thereupon.

Electric Field Supporting Electrolyte (EFSE)

Because the ionic conductivity of the electric-field-supporting-electrolyte (EFSE) is always quite small the term "electrolyte" as used herein is further explained. The electric-field-supporting-electrolyte is a highly resistive fluid, containing none, or only a relatively small concentration of ionic species. In some cases the electrolyte is simply a solvent (preferably non-flammable) such as ultra-pure water (de-ionized water), supercritical carbon dioxide, or ammonia. Organic solvents such as propylene carbonate, ethylene carbonate, dimethylcarbonate, diethlyene carbonate may also be used. Gasses can also be used, though they require larger imposed electric fields. Suitable gasses include hydrogen, helium, argon, oxygen, $BF_4$, $SF_6$, and gas mixtures. Water is found to be particularly useful because of its low cost, environmental friendliness and high abundance, but certain conditions may make the use of other materials/solvents also desirable. The concentration of ionic species (or ionic complexes) in the EFSE is generally less than $10^{-2}$ moles/liter, more generally less than $10^{-3}$ moles/liter. The resistance of the EFSE electrolyte is typically less than 1 microohm cm, preferably less than 0.1 megaohm-cm. The average electric field imposed between the workpiece and the EFIE and across the EFSE is quite large, for example greater than $5 \times 10^5$ volts/cm. As a specific example, the average distance between the EFIE and some "raised" portions of the workpiece closest to the EFIE may be less than 500 Å and the voltage between the workpiece and the EFIE surface may be greater than 6 Volts. In this example then, the electric field strength is $1.2 \times 10^7$ volts/cm. This exceeds the breakdown voltage of most solvents, and under such large fields the solvent of most electrolytes will decompose, and so it is expected that in many cases solvent breakdown is expected to occur concurrently and may even aid in the SEAR process. As noted above, for example, in the case of the use of water and when the workpiece is anodically polarized, oxygen may be formed along with the formation or protons and this may aid the removal of the accelerator and/or the removal of the metal onto which the accelerator is attached (e.g., by avoiding the formation of a resistive metal oxide and changing the pH to acidic conditions locally).

The Electric Field Imposing Element (EFIE) and Proximity Focusing Interface (PFI)

The Electric Field Imposing Element (EFIE) may be, for example, a single element or material (in which case the proximity focusing interface and the electric field imposing element are one and the same). But in other cases, the EFIE may contain multiple elements making the proximity-focusing interface (PFI) more useful. Therefore, the EFIE may be composed of a number of sub elements or components, one of which is the PFI.

The PFI may be a solid, a liquid, a gel, or a polymer (including an ionic conducting polymer). The EFIE PFI may be an electrical conductor, such as a metal. Alternatively, the PFI may be an ionic conductor (e.g. a cationic membrane). Still further, the PFI may be porous on a microscopic scale, being resistive to, but still allowing flow under sufficiently high pressure, where the bulk transport of both liquid solvent and current carrying ions contained therein can be moved. Alternatively, the proximity focusing interface may be nanoporous (allowing or rejecting flow of certain sized molecules and/or ions on a molecular scale) such as typically employed in reverse osmotic operations.

In another particularly preferred embodiment, the proximity focusing interface comprises a solid ionic conducting polymer, such as an anionic or cationic conductive and/or selective membranes (e.g., Nafion™ available from DuPont Corporation). The EFIE PFI may also be a material that is both an electrical and ionic conductor, such as an electrolyte filled electrically conductive material (e.g., nano-metal foam or carbon aerogel).

Examples of EFIE materials and constructions include 1) a flat, electrically conductive electrode (e.g., a polished-flat solid electrical current collection anode or cathode constructed of metal); 2) a metallic surface film or coating on a very flat, smooth, or polished insulator (e.g., a film coating on a smooth, polished piece of silicon or silicon wafer); 3) an electrode formed from a thin metal film or foil; 4) a thin metal film coated on an plastic or elastic substrates (e.g., a metal film on a rubber or polymer, such as Mylar); 5) a solid piece or film of porous, non-conductive inorganic or inorganic material (e.g.) polymer filled and containing an electrolyte within its pores (e.g., porous "fitted" silica glass, silica aerogel, resorcinol-formaldehyde derived organic aerogel); or 6) a cationic or anionic conductive membrane (e.g., Nafion™, by Dupont). Specific examples of a liquid EFIE include ion-contain, ion-conductive electrolytes substantially immiscible with the underlying EFSE or liquid metals (e.g., mercury).

In a preferred embodiment, a thin film EFIE (e.g., thin metal film, metal coated film on an elastomer or polymer, a cationic and anionic membranes, or films of aerogel) is constrained along its periphery, and pressurized on one side. See FIGS. 4 and 5. The membrane or film deflects toward the membrane to create a proximity-focusing element, whose face closest to the workpiece is the proximity-focusing interface. The proximity-focusing element is inflated ("blown-up" like a balloon) by having a pressurized fluid on the non-EFSE side of the EFIE. This is found to be helpful in achieving compliance of the EFIE over longer lengths and, when combined with relative movement between the workpiece and the EFIE and induced EFSE flow in the gap between them and control the spacing between the working and counter electrodes. Alternatively, an elastic element (preferably porous when ions must move through it in the case of using a ion carrying membranes) can be used behind the EFIE which is deformed along with the EFIE when it is brought in close proximity to and traversed near the substrate interface.

In some embodiments, the surface of the EFIE will not substantially or significantly follow the topography of the surfaces on the scale at which accelerator is desired to be selective removed. Rather, the surface of the EFIE may span the recessed regions rather than stepping to follow the workpiece topography thereby making the separation between the EFIE and the workpiece surface within the recess larger than it is between the EFIE and the raised regions or general surface. The properties of the EFIE combined with the compressibility properties and flow characteristics of the EFSE and operating conditions may need to be considered to achieve this. While the EFIE is flexible in some embodiments and therefore may substantially deform and penetrate into the recessed regions under conditions under which the workpiece and the EFIE are not moving with one another, the relative motion, the incompressibility of the pressurized fluid and viscous flow forces (when using liquid EFSE) and pressure of the assembly can enable the EFIE to traverse or "fly" over recessed regions of considerable size and low aspect ratio. In other cases the EFIE may actually touch the surface, either continuously, periodically, or intermittently. The spacing between the EFIE and the workpiece can also be controlled and maintained as described in U.S. Pat. No. 6,756,307 and PCT Application No. WO 2005/042810 in the names of Mazur et al., both of which are incorporated herein by reference.

In some embodiments, the EFIE may be porous to the macroscopic flow of either the EFSE or electrolyte contained in or behind the porous electrode. In certain embodiments, the EFIE should support conditions of creating a proximity focusing element and interface that has a highly equipotential surface facing the workpiece. The resistance of the power supply lead or the counter electrode to the proximity focusing interface is typically much smaller than (usually 1% or less) than that across the electric-field-supporting-electrolyte (EFSE). This may be achieved by using EFIE proximity focusing elements having high electrical conductivity (as in a metal or semiconductor) or having a highly conductive ionic solution or ion transport material between the counter electrode and the proximity-focusing interface. In the latter case, the proximity-focusing interface is removed or remote to the electrochemical pairing reaction, being located spatially away from the proximity-focusing interface (for example, when using a cationic membrane). This creates a "virtual electrode" at the EFIE front surface that may be in the form of a solid member or body that contains a surface that faces the working electrode and exhibits a substantially constant (equipotential) voltage and acts in a physical manner as if a faradaic electrode was in the same given location, In cases where a membrane PFI is used, the front surface of a membrane proximity focusing element at its interface is substantially held at a near-constant voltage because of the relative resistances of the system. The voltage gradient changes abruptly and becomes nearly constant beyond the proximity focusing interface, as shown in FIG. 1. A schematic of the voltage and current profiles between the workpiece and proximity focusing interface, and around a recessed and raised region is presented in FIG. 2. Areas where lines of current are depicted closer together are regions of higher current density.

Method of Electrochemical Selective Removal of Plating Accelerator

While the term removal in describing the SEAR process has been used, it is understood that it is not necessarily required for the accelerator to be physically removed from the surface to achieve the goals of the invention or to practice this invention. For example, the accelerator may be simply altered (e.g. decomposed, oxidized, reduced, or otherwise modified). The accelerator may be driven into or buried underneath a deposit during the process (e.g., by metal electrodeposition or ion-bombardment). But regardless of the manner in which it is accomplished, the chemical functionality of the accelerator as an accelerating compound is diminished or eliminated by the SEAR process through the presence and action of the EFIE.

SEAR differs from the prior art in part, because it involves the preferential or selective removal of a chemically active or electrochemically active compound globally attached or adhering to an exposed workpiece surface by any one of many techniques, including electrochemical techniques. The chemically active material has the properties such that (1) due to its presence and in location where it is bound; and (2) when combined with other materials and processes, it has a reduced inhibition to deposition. In the case of electro-deposition, the deposition is accelerated or is less polarized in the regions where the molecules of chemical active material are present. The strength of the bond of the accelerating molecule with the surface must be sufficiently strong such that surface diffusion of the molecule is slow with respect to the time over which selective removal and plating occur, and the accelerating molecule must not become substantially incorporated or otherwise loose its accelerating characteristics during the deposition process.

Plating of Metal after Accelerator is Selectively Removed

Generally, any deposition process known in the art may be used. According to the present invention, the plating deposits metal preferentially into recessed regions of a workpiece without requiring special controls to balance the rates of additive deposition and removal. The conditions for filling low aspect ratio and high aspect ratio features are, however, often different, and in many cases are performed in separate operations, using different materials, equipment and steps. But the invention may be practiced without continually contacting or otherwise modifying the work-piece surface during the various steps of depositing the layers on the workpiece. Use of a physical contacting device at any point in the process is not required in many embodiments of the invention. The process of the invention is advantageously fast and can lead to excellent contrast between the relative deposition rate within the initially recessed features and the field areas.

Embodiments of Workpiece Processing Using SEAR

The invention is useful in achieving filling of features of both high and low aspect ratio features. While the general SEAR procedures for filling these two classes of features are similar, the specific operating conditions and flows can be slightly different, so these are in one case disclosed as separate embodiments. However, in many embodiments of the invention, the features are filled sequentially, filling high aspect ratio features first, and then filling low aspect ratio features on the same workpiece. In other embodiments only high aspect ratio features are filled by SEAR technology, and, for example, standard electrodeposition "overplating" is performed to fill low aspect ratio features. Finally, in other embodiments, high aspect ratio features are filled by classical methods, and the SEAR process is used only to selectively fill low aspect ratios.

High Aspect Ratio Feature (Features Deeper than Wide) Filling

Prior to applying the steps of SEAR for high aspect ratio features, the workpiece is first optionally pretreated. Examples of pretreatment include applying a reducing agent to remove surface oxides, depositing a metal seed layer (liquid atomic layer deposition or electroless deposition), or simply application of a wetting agent. A preferred method of selective high aspect ratio feature filling begins with the step of treating the surface with accelerator by chemical exposure of the surface (e.g., by spraying with a solution) or exposure of the surface to an electrolytic solution that is used to electrochemically form an accelerator on the surface. For example, one can 1) spray a surface with a water solution containing the chemical mercaptopropane- or mercaptoethane sulphonic acid (chemical treatment method) or 2)

cathodically polarize (applying a reducing potential and current to) a workpiece in a bath containing an electrochemically active accelerator. The resultant structure is schematically shown in FIG. 3a. Metal atoms 11 (which often starts as a metal seeding layer) with attached accelerator molecules 13 and dielectric substrate 18 are shown. In FIG. 3d the workpiece 10, PFI 14 and EFIE 15 are schematically shown. The metal atom 11, metal ion 12 and accelerator molecule 13 symbols are common to FIGS. 3a-3d. The electrochemically active accelerator is, in many cases, a compound that can be transformed into a chemically active accelerator, such as a dimer of an accelerating compound (e.g. dimercaptopropane sulphonic acid or dimercaptoethane sulphonic acid). This transformation of the accelerator often occurs by an electrochemical reduction process performed with or without simultaneous metal electrodeposition. For example, in the case of electrochemical activation, the electrolyte may also contain other materials such as metal ions (e.g., copper), a suppressor, chloride ion and leveler compounds useful in the deposition of metal and the conversion of the accelerator to a surface chemically active form, and metal deposition may occur concurrently with accelerator deposition. As a specific example, as electrochemical current is passed, it is believed that a dimer such as dimercaptopropane sulphonic acid is reduced to the monomer mercaptopropane sulphonic acid, and becomes then strongly attached to the surface. The concentration of accelerant used in this step is generally quite low, for example 2-50 ppm of mercaptopropane sulphonic acid or dimercaptopropane sulphonic acid (MPSA and DMPSA). The chemical or electrochemical treatment typically takes from about 2 to 30 seconds. Currents (when applicable) are from 0.5 to 5 mA/cm$^2$. The concentrations used are generally much lower than those suitable to fill low aspect ratio features discussed below, because the process relies on a surface area reducing mechanism and the concentration of accelerator during the feature filling process to achieve its goal.

Figure 9:
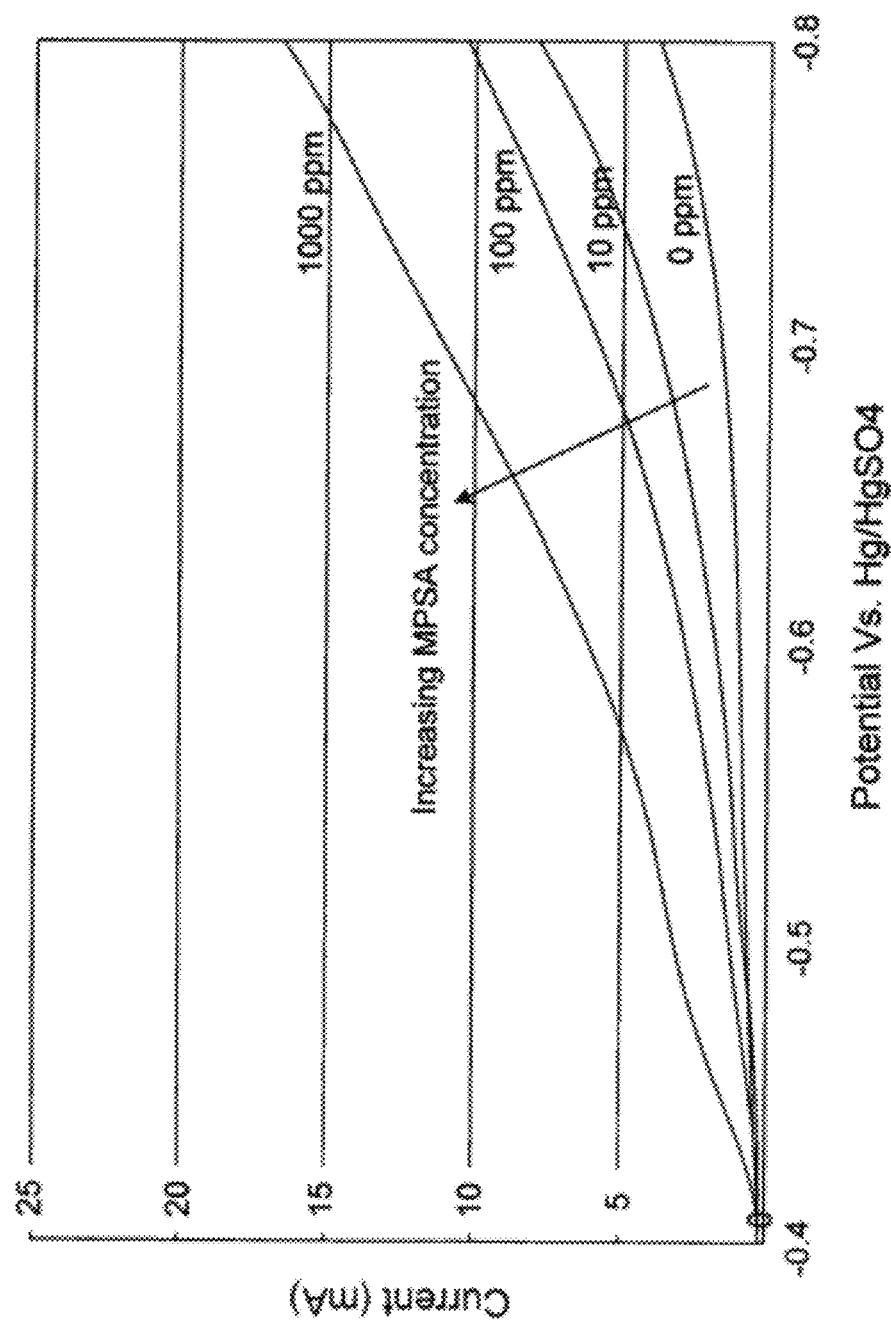
FIG. 9 shows linear potential sweep response curves of a rotated copper disk after acceleration dosing for 10 sec.
Figure 10:
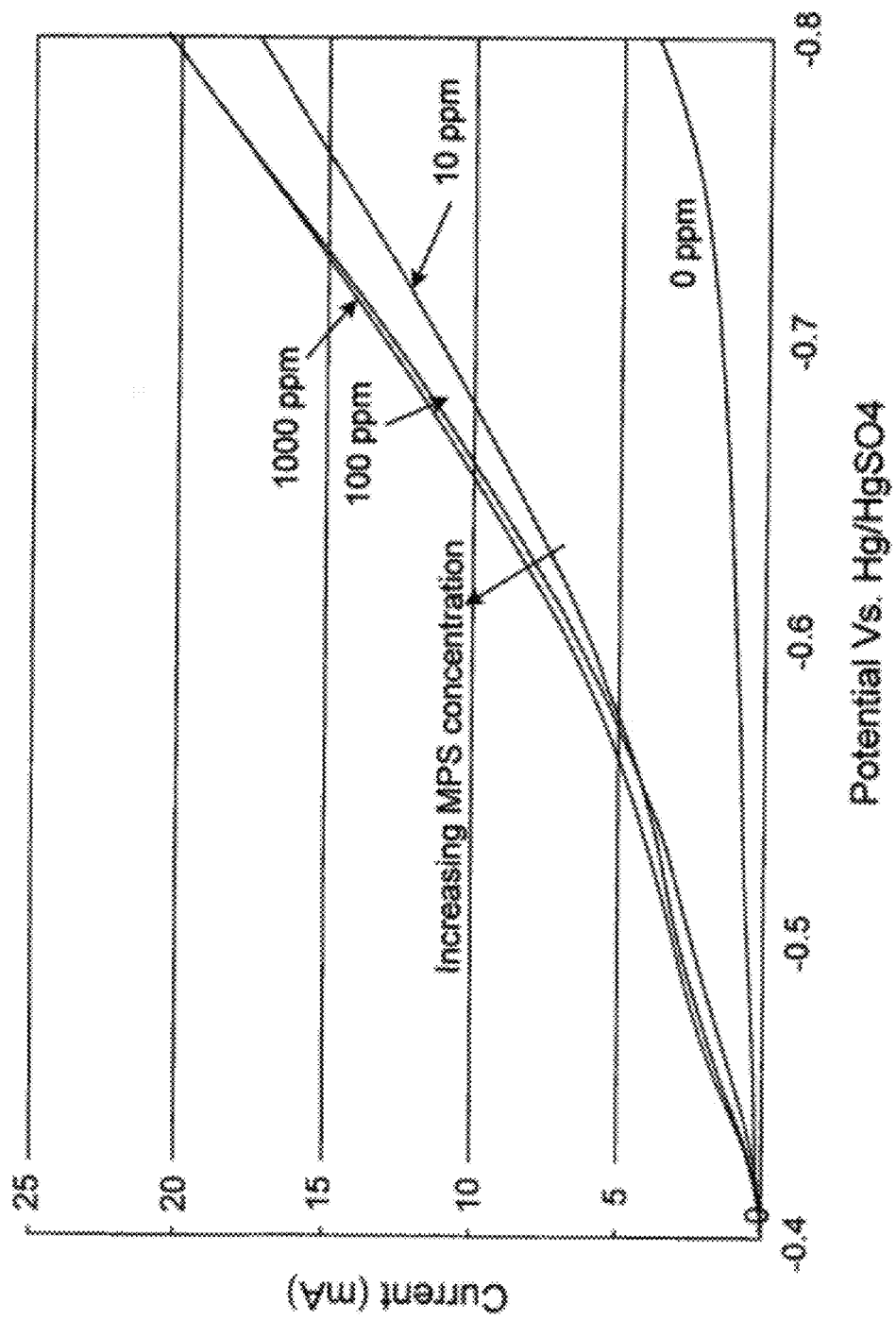
FIG. 10 shows linear potential sweep response curves of a rotated copper disk after acceleration dosing for 100 sec.

Referring to FIGS. 9-11, exemplary results of testing of sub-saturated accelerator "surface dosing" are shown. Before each test, a copper rotating disk was first cleaned and polished by performing electropolishing in a 85% phosphoric acid solution, as known in the art (see, for example, U.S. Pat. No. 5,096,550 naming Mayer et al. as authors). This process is seen to both removes any adsorbed accelerator deposited on the surface from previous experiments and produces a reproducibly smooth surface as demonstrated by the fact that it reproducibly creates curves, and, without dosing, indicates the complete absence of adsorbed accelerator. Next, the electrode is immersed while rotating at 300 rpm into a solution of predetermined accelerator concentration for a predetermine time (thereby "dosing" the surface with the accelerator). Immediately after this process, the surface is rinsed with a spray of fresh deionized water. The rinsing effectively terminates the potential for any further accelerator adsorption by eliminating its supply. FIGS. 9 and 10 show linear potential sweep response curves of a rotating copper disk (electrode area ~0.7 cm$^2$) after 3-mercaptopropane sulphonic acid accelerator dosing at 10 sec and 100 sec, respectively. Accelerator dosing with other known plating accelerators showed similar behavior, though the times, concentrations, saturation conditions and voltammetry (changes in polarization) differed somewhat. The electrolyte used in FIG. 9 contained 175 g/L sulfuric acid, 17.5 g/L copper ion, 1000 ppm Basf Pluronic™ L-62 polyethlyene glycol (as a plating bath suppressor), and 50 ppm chloride ion. The behavior is not specific to this particular bath formulation (acid concentration, metal concentration, suppressor concentration or molecules) or metal (e.g. silver, gold, nickel show similar behavior). Generally, the particular chloride concentration is paired with the particular type of suppressor being used, though its required concentration tends to be less than about 100 ppm to be effective. The counter electrode is a sheet of copper foil, and the rotation rate was set to 100 rpm. The potential is swept to progressively more negative values from its open circuit value of approximately −0.4V vs. Hg/HgSO$_4$ at 20 mV/sec and the current response recorded. These and other results (e.g. varying the rotation rate vs. dosing operation) demonstrate the ability to modify the polarization behavior and tailor the amount of adsorbed accelerator between zero and its saturated value by varying the concentration of accelerator in the dosing solution, the time of exposure, and the mass transport convection conditions (e.g. rotation rate). The trends show that at relatively low concentration and shorter times (10 ppm and 10 seconds for MPSA) yield only a small amount of acceleration, but at high time and concentrations (estimated for MPSA as when the product of the exposure time and concentration exceeds about 5000 ppm*sec) yields a saturated condition. The saturation value may represent complete monolayer coverage of accelerator film, or some other thermodynamic limit.

FIG. 11 schematically illustrates the expected relationship between accelerator dosing and fractional acceleration (related to local deposition rate, or current density) for a particular deposition condition (e.g. accelerator molecule, electrodeposition voltage, temperature, CVD chamber pressure, etc.). The y axis, termed the fractional acceleration, "f", is a measure of the local relative amount of accelerated deposition (related to the depolarization for electrodeposition) of a surface. It is relative to the extremes of no acceleration (slowest possible deposition rate) and saturated or maximum acceleration (fastest possible deposition rate). Its value typically therefore varies between a value of zero and one. Fractional acceleration can be a function of many parameters, but for this discussion with all other parameters fixed, is related to the amount of accelerator (surface concentration or accelerator dosing exposure), "A", at a point on the surface. In general, fractional acceleration will also be a function of the composition and condition used for the deposition (e.g. acid concentration, metal ion concentration, suppressor type and concentration, temperature, applied potential, etc), though generally only a weak function of time unless the accelerator is forcibly removed, destroyed, or geometrically concentrated or dispersed. In the case of deposition by electrodeposition, fractional acceleration, "f", and can be determined for a particular set of operating condition by the relationship $$f = \frac{(i_{acc} - i)}{(i_{acc} - i_{sup})},$$

where $I_{acc}$ is the metal deposition current density (or deposition rate) with a saturated or nearly saturated surface concentration of adsorbed accelerator, $i_{sup}$ is the current density (or deposition rate) of a surface deposited under the exact same conditions except with no adsorbed accelerator, and i is the current density (or deposition rate) of the surface with some intermediate concentration of surface accelerant concentration or exposure between these two extreme limits. The accelerator surface concentration that corresponds to the current density i may change in time at a particular point on the surface by geometric concentration (reduction or increases in local surface). This will change its local value of f, and hence is corresponding deposition rate. Alternatively, the concentration of acceleration can change by first being saturated (by directly chemical exposure and having a corresponding local value of unity for f), and then creating a sub-saturated concentration a SEAR or SMMART process. As can be seen in the figure, points on the curve where small changes in concentration lead to large changes in acceleration rate (e.g. low values of fractional acceleration and dosing in this figure) are desired when using geometric concentration effects are desired (such as filling high aspect ratio features). It is believed that if the concentration is too high, geometric concentration of accelerator will not lead to any significant change in polarization or further increase in fractional acceleration or deposition rate (flat portion of the f vs. A curve at higher values of A). For SAP, SEAR and SMMART processes, starting with a saturated concentration leads to the recessed feature filling being at the highest possible rate. Then, if all or nearly all accelerator can be removed from the field, the contrast in deposition rate between the locations where the accelerator has been removed (the field) and within the feature is achieved. The authors not, however, that there are a few cases which this general principle of saturating a surface with accelerator to achieve maximum contrast in deposition rate is violated. Specifically, when removal of accelerator from a sub-saturated surface is easier or more complete than from a saturated surface, and/or the resultant difference in plating rates achieved between regions of applied and un-removed accelerator and removed accelerator are greater if using a less than saturated concentration, then a sub-saturated condition may be useful.

Figure 12A:
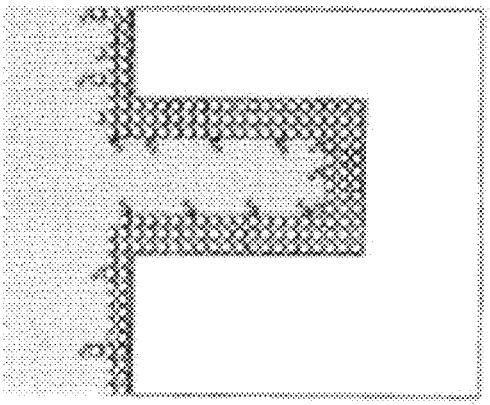
FIGS. 12a-12c are diagrams sequentially showing high aspect ratio filling with sub-saturated accelerator dosing.
Figure 12B:
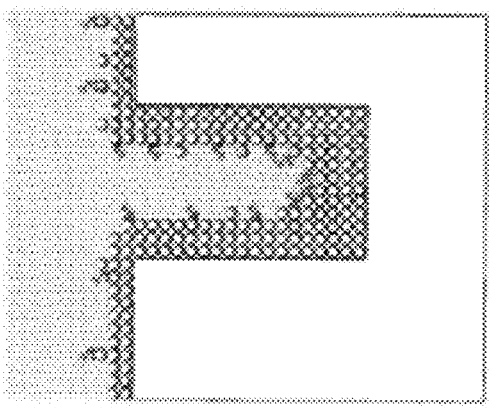

The surface concentration in FIG. 11 is at an optimal desired surface state 80 on the field and raised regions after accelerator removal. The next part 81 of the isopotential acceleration curve indicates the range of the desirable state within a high aspect ratio feature during fill. The portion 82 of the curve is the range of the undesirable state for low aspect ratio feature fill. Finally, The portion 83 of the curve indicates the desired surface concentration prior to accelerator removal from the field for low aspect ratio feature fill. If we assume 1) that a uniform concentration of surface adsorbed accelerator is deposited on the surface and in a field, 2) if the surface concentration of accelerator is such that an increase in concentration will lead to a further depolarization of the surface for the deposition process, and 3) that the accelerators surface diffusion is much slower than the rate and time for the deposition process, then as a feature grows, its local surface area will decrease its local polarization will also decrease, resulting in an increasing rate of deposition. Therefore, under these conditions, plating will initially occur more rapidly at the features bottom corners (FIG. 12a). Later, the features corners meet, and the feature begins to growth from the bottom upwards (FIG. 12b). As it does so, the feature continues to collect accelerator from the side-walls (FIG. 12c), increasing the surface concentration and resulting in a continuously decreasing polarization, until either the concentration becomes saturated or the rate of change with further increase in accelerator becomes negligible. The critical element in achieving this high aspect ratio filling process is setting the appropriate preconditions for the process, namely a concentration of accelerator at a significant sub-saturated level, and not allowing the deposition rate at the upper wall surface being to high so as to close the feature off before the metal fills from the bottom. Therefore, prior to initiating and for achieving optimal filling, the upper section of the cavity should 1) have a side wall structure that is slightly open or vertical (but not constricted or necked, which might lead to the formation of a fill choke-point) and 2) the concentration of accelerator should decrease from the bottom of the feature to the opening, ideally with the concentration being zero near the top and on the field. Examples of how to achieve these goals using this invention are now presented.

Figure 12C:
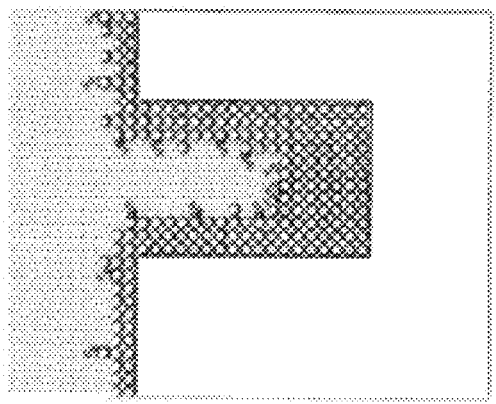

The data of FIGS. 9 and 10 are derived from flat surfaces. Depending on the concentration of the accelerator or accelerator precursor and other operating conditions (e.g. current, flow, temperature, etc.), it is believed that the rate at which accelerant become attached may result in preferential concentration at the exposed field regions and less in the restricted areas. This is potentially the opposite of the desired configuration useful in filling the features, as noted above. In other cases it may be possible to achieve substantially more uniform surface concentrations, but generally the surface concentration at these early stages will likely be lower on the surfaces inside the feature due to its limited accessibility to the accelerator source from the solution. Only later in the process, when metal is deposited (initially isotropically) over the surface and geometric concentration of accelerator on that surface can occur, can one achieve higher concentrations within the recessed regions, as shown in FIGS. 12a-c. The metal atom and accelerator molecule symbols in the figures are the same as those used in FIG. 3d. However, if one selectively removes some or all of the accelerator from the field/raised-surface after the accelerator has been deposited over the whole surface, an improvement in the relative rates of plating within the features can be achieved as shown in FIG. 3b. Selective removal is achieved by using the method described herein where the electrochemical action occurs preferentially in regions near the exposed surface (field), with little or no removal of accelerator or metal inside the feature.

As another embodiment, a surface may be electrochemically plated (e.g. 0.5 to 30 seconds, 0.5 to 5 mA/cm$^2$, 0.25-150 coulombs charge) in a bath containing 10 to 100 ppm dimercaptopropane sulphonic acid, 10 to 80 g/L copper sulfate, 10 to 200 g/L sulfuric acid and 100 to 1000 ppm L-92 polyetheylene oxide suppressor. These ranges are for illustrative purposes only as other combinations and ranges are possible. Alternatively the surface may be treated with 2-50 ppm mercaptopropane sulphonic acid for from 2 to 30 seconds. After either of these operations (or one followed by the other) the surface is completely rinsed of electrolyte with deionized water. See FIG. 3b. Next, SEAR is performed on the surface. High resistivity water is applied over the surface, the surface is rotated or otherwise passes under the EFIE, the unit is anodically polarized (or alternatively cathodically polarized) and electric current is passed between the workpiece and the EFIE.

When anodic polarization is used, some metal on the substrate may be concurrently removed with the accelerator. As an additive benefit, such metal removal may be performed preferentially at the top opening (the neck) of a feature in order to remove undesirable accumulated metal that often limits the ability to fill extremely deep features. Hence, if a process that is previously used to deposit metal (such as PVD seeding of the surface) yields a constricted or necked feature opening, anodic polarization using the same methods and apparatus for SEAR can also be used to preferentially remove metal there and open up the feature. This is graphically represented in FIG. 3c. This is a "side reaction" or side benefit that may be favorable where it aids in dislodging, or "undercutting" the attachment of the accelerator from the surface. Therefore, quite apart from the use of SEAR to selectively remove accelerator from exposed planar surfaces, SEAR has an independent use in providing a method of removing accumulated metal forming a constricted choke-point or neck at the opening of a recessed region at the surface of a workpiece. Generally, this comprises the steps of (a) providing a workpiece having a surface with exposed surface regions and recessed regions, wherein at least some of the recessed regions are characterized by necks of accumulated metal; (b) causing a plating accelerator to become attached to the surface including said recessed and exposed surface regions; and (c) selectively removing the plating accelerator from the exposed surface regions while the workpiece is electrically polarized without performing substantial metal plating on the surface whereby metal forming the necks is also preferentially removed. This general method of removing accumulated metal may be then be optionally followed by the step d) after step (c) is at least partially complete, plating metal onto the surface, whereby the plating accelerator remaining attached to the surface increases the rate of metal plating in the recessed regions relative to the rate of metal plating in the exposed surface regions.

In further describing this process the solvent (e.g. water) decomposes, and some current associated with this additional side reaction is also consumed. The formation of acid (protons) may help to decrease the pH at the surface and improve the solubility of the metal (rather than, for example, having it form a metal oxide). The fraction of current associated with the side reactions (not directly associated with faradaic charge transfer to the accelerator itself) can be large, approaching 100%. However, the amount of material removed is generally very small. As little as 10 to 100 A appears to be sufficient in many cases to remove almost all the accelerant from the surface. In some cases essentially no metal removal is required. Removing too much metal at this point in the process where there is often very little metal covering the surface makes control and minimization of the removal important. Charges from 20 to 200 $mC/cm^2$ are found useful. In many cases as little as 10 $mC/cm^2$ are less can be used. The voltages applied across the EFSE may range from 3 to 20V, generally 5 to 10 V are useful. Current or voltage pulsing (on/off, reversing direction, etc.) may be applied as desired, and may enable better process control in some operations.

After removing the accelerator from the field areas using the SEAR as described above, the wafer is typically placed into an electrolytic plating solution. In preferred embodiments the electrolyte contains metal ions, a suppressor, chloride ion, and an acid, optionally a leveler, but little or no accelerator (either electrochemically active or chemically active). Small amount of accelerator and leveler compounds, when used, primarily serve the function of controlling the surface texture (e.g. increasing the surface brightness by reducing micro-roughness as well is mitigating the formation of any growth protrusion), changing the grain orientation and size, and incorporating desirable impurities that aid in the annealing process. The process is continued until the features are filled. Filling is superior to a process in which the SEAR step is not performed because a much larger difference between the concentration of accelerator in the feature to that on the field or near the feature opening is achievable.

Filling Low Aspect Ratio Features

Filling of low aspect ratio features (features wider than deep) proceeds using some similar approaches as for high aspect ratio features. However, generally it is desirable to contact, adhere to, and/or react with a much higher concentration of accelerator to the surface before selectively removing it from high field areas using SEAR. Because the features are wider than they are deep, geometric concentration of accelerator does not appreciably occur in this process and therefore that process (geometric concentration) does not significantly lead to selective filling. The process proceeds primarily by creating different relative amounts of plating accelerator at the recessed regions and the field regions, which remains largely unchanged throughout the filling process. Therefore, creating a saturated or near saturated accelerator concentration is desirable. For example, a higher concentration of DMPSA should be used and a larger current density applied to achieve a high concentration of surface accelerating monomer from the electrochemical conversion (reduction) of the dimer. For example, 50 to 500 ppm DMPSA and current densities of greater than 5 $mA/cm^2$ for 5 to 20 seconds are useful. Alternatively, direct chemical adsorption of MPSA from an aqueous solution at concentrations of 50 to 2000 ppm for 2 to 10 seconds are also effective. After application of the accelerator, the surface should be completely and thoroughly rinsed, and removal of the accelerator performed from the exposed field regions using SEAR proceeds in a similar manner to that for high aspect ratio features. For use specifically on low A/R features, a stiffer, less flexible and less compliant EFIE PFI may be desirable to maintain the spacing between the bottom of features and the PFI, because the distance between the edges of the feature are larger and penetration or dishing into the feature is expect to be greater. Different operating conditions (higher velocities between the workpiece and the PFI and higher electrolyte flow rates) may be desirable. It is desirable to maintain electrode spacing and hence contrast between the removal of accelerator from the recessed regions and field regions. However, control of the amount of metal removed from the field is often less critical than during high aspect ratio filling. Metal deposited on the field during the high aspect ratio feature filling process increases the amount of metal that can be removed from the field areas before all field metal is removed from some locations. Also, preferential removal at the mouth/edge of the feature is less likely to improve the process, because closure of the very wide feature does not occur as it can in very narrow, high aspect ratio features. Some metal removal or decomposition of the metal can be expected and may be advantageous when anodic removal of the accelerator is the method of operation. In cathodic reduction SEAR, the workpiece is cathodically polarized and formation of dissolved molecular hydrogen (as dissolved gas) is a typical side reaction and product.

Embodiments of Hardware Configurations of the EFIE

Figure 4:
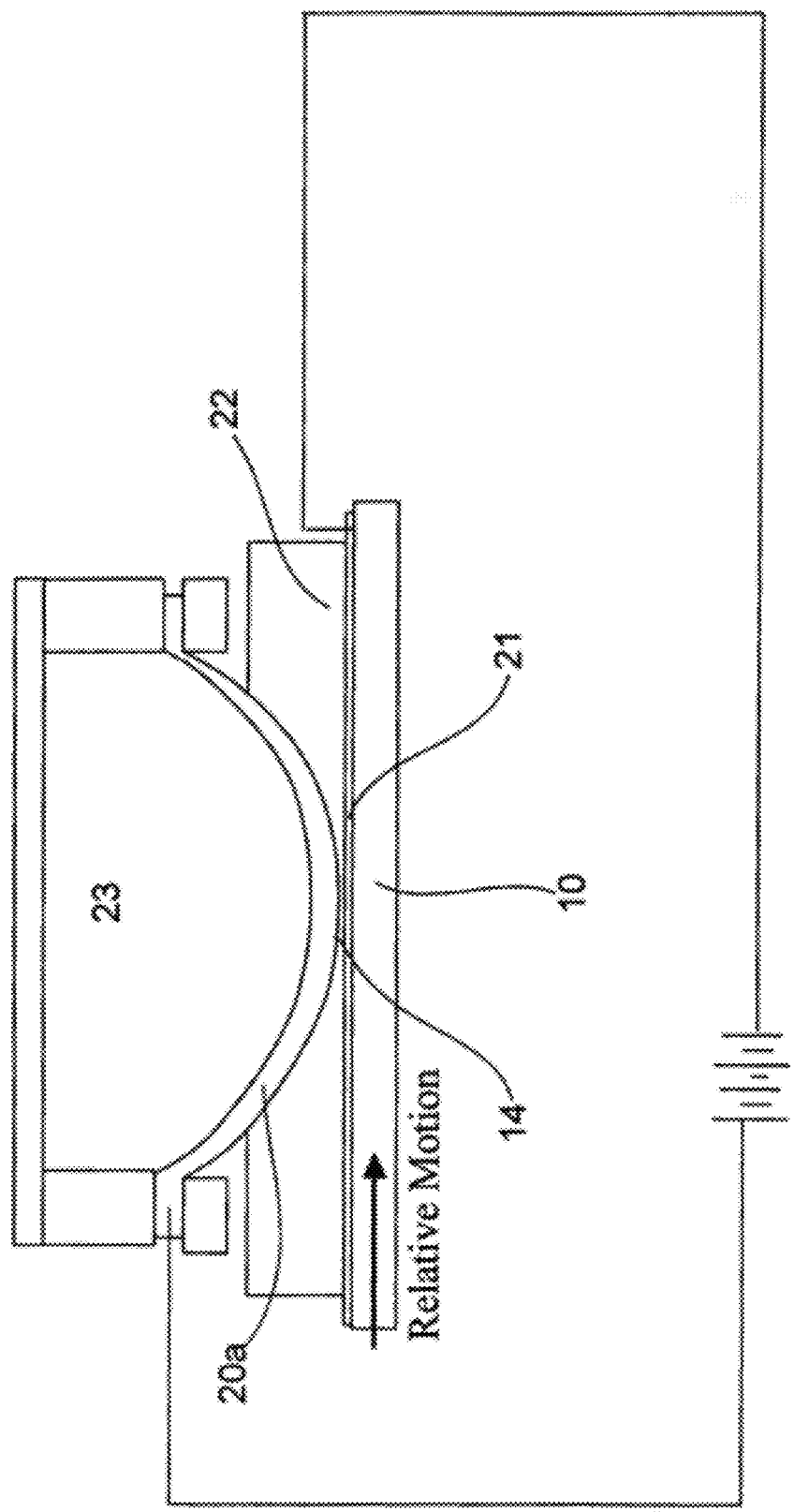
FIG. 4 is a diagram of an EFIE accommodating a metal foil PFI according to the invention.

In particularly preferred embodiments of the hardware, referring to FIG. 4, the EFIE proximity focusing interface 14 comprises a metal foil 20a or plastic film coated with a metal film, creating a PFI membrane. The foil, forming a chamber 23 with upper and side walls of the EFIE is inflated with fluid (gas or liquid) on the opposite side of the foil from the proximity focusing interface and workpiece 10, workpiece metal surface 21 electrolyte (EFSE) 22. The composition of the metal film should resist corrosion by materials used in the operation. Examples of suitable materials for the metal film include noble metals (Pt, Pd, Ir, Au) and other electrochemically stable materials (Ru, carbon, mercury). A chamber containing the inflating fluid is selectively pressurized to establish membrane rigidity and control. The membrane is pressurized and brought in close proximity to the surface while the surface is wetted with high resistance electrolyte (EFSE) and while the workpiece is moved under the membrane. The relative speed of the workpiece and membrane is typically 5 to 100 cm/sec, more specifically 10 to 50 cm/sec when using water as an EFSE. A power supply connected to the workpiece and EFIE (for example, by an electrical contact at the workpiece periphery and a metal film membrane) is energized, imposing a voltage between the two electrodes and allowing current to pass. One should avoid physical contact of the metal film with the workpiece, because if it does touch, direct electronic current (as opposed to ionic current) will pass between the workpiece and the film, and reduce or stop the removal of the accelerator. If contact occurs, polarization of the EFSE is reduced and the removal efficiency is diminished. Also, electronic arcing or even welding of the surfaces might occur, so in use, the metal foil PFI spatial separation must be maintained. The membrane can be moved over the surface as required to achieve selective removal of the accelerator. As noted above, some metal removal and solvent breakdown products may form concurrently with the process of removing the accelerator. If metal is deposited onto the PFI from the workpiece, periodic removal of that metal can be accomplished by periodically etching the deposited metal from the PFI interface. In the case of deposited copper on a Pt foil membrane, a number of suitable etchants may be used, such as a mixture of hydrogen peroxide and sulfuric acid, or nitric acid. Alternatively, any deposited metal may be removed by reversing the current direction to deposit the metal onto the workpiece or onto a sacrificial body. While other materials can also be used for the PFI or as an etchant to facilitate removing metal deposited on the PFI, when metal from the substrate is deposited on the EFIE, use a noble or suitable material that allow the metal to be subsequently removed without effecting the EFIE base material (for example, by chemical etching or anodic oxidation) is a useful attribute.

Figure 5:
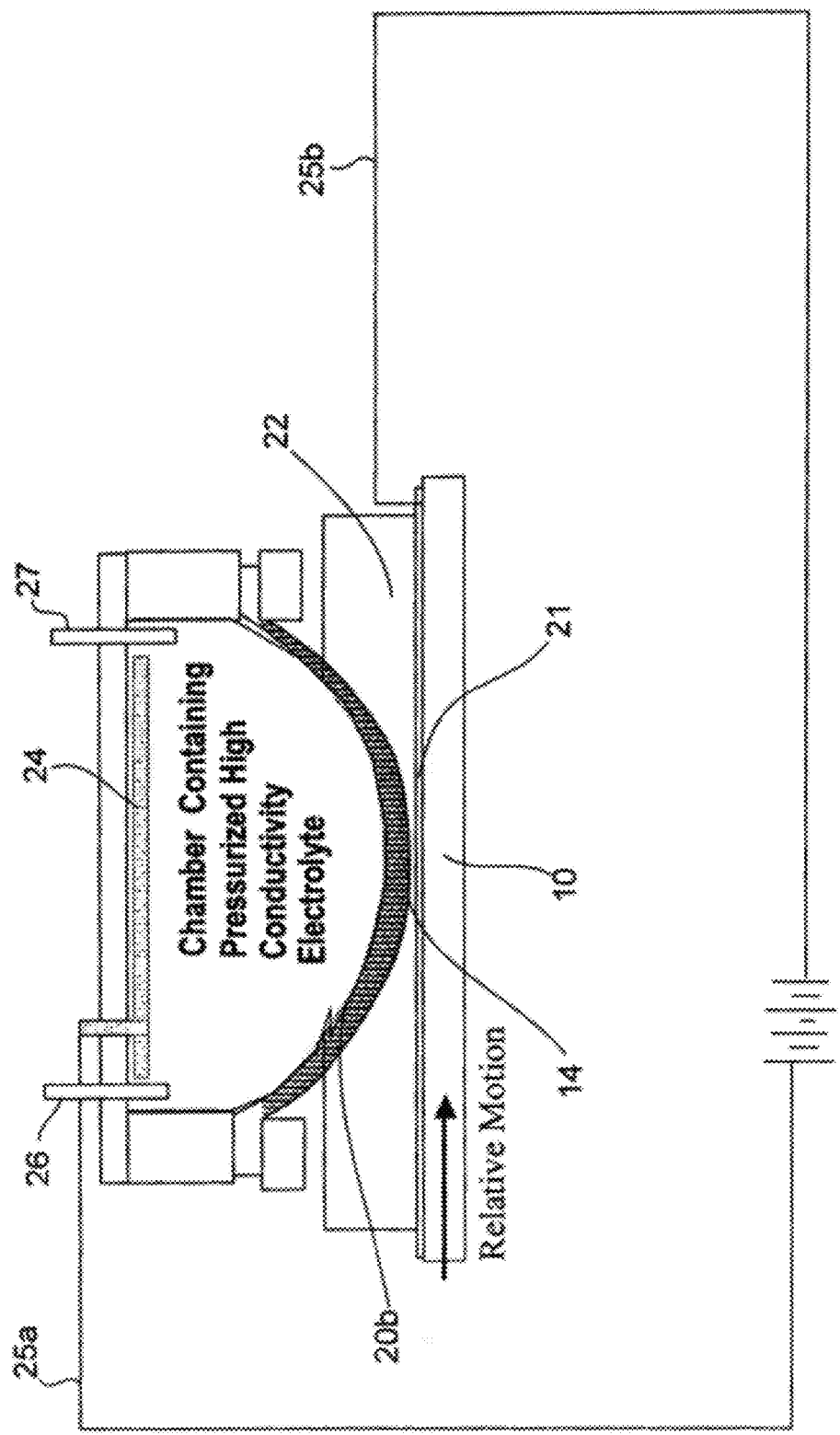
FIG. 5 is a diagram of an EFIE accommodating an ion-conducting membrane PFI according to the invention.
Figure 6:
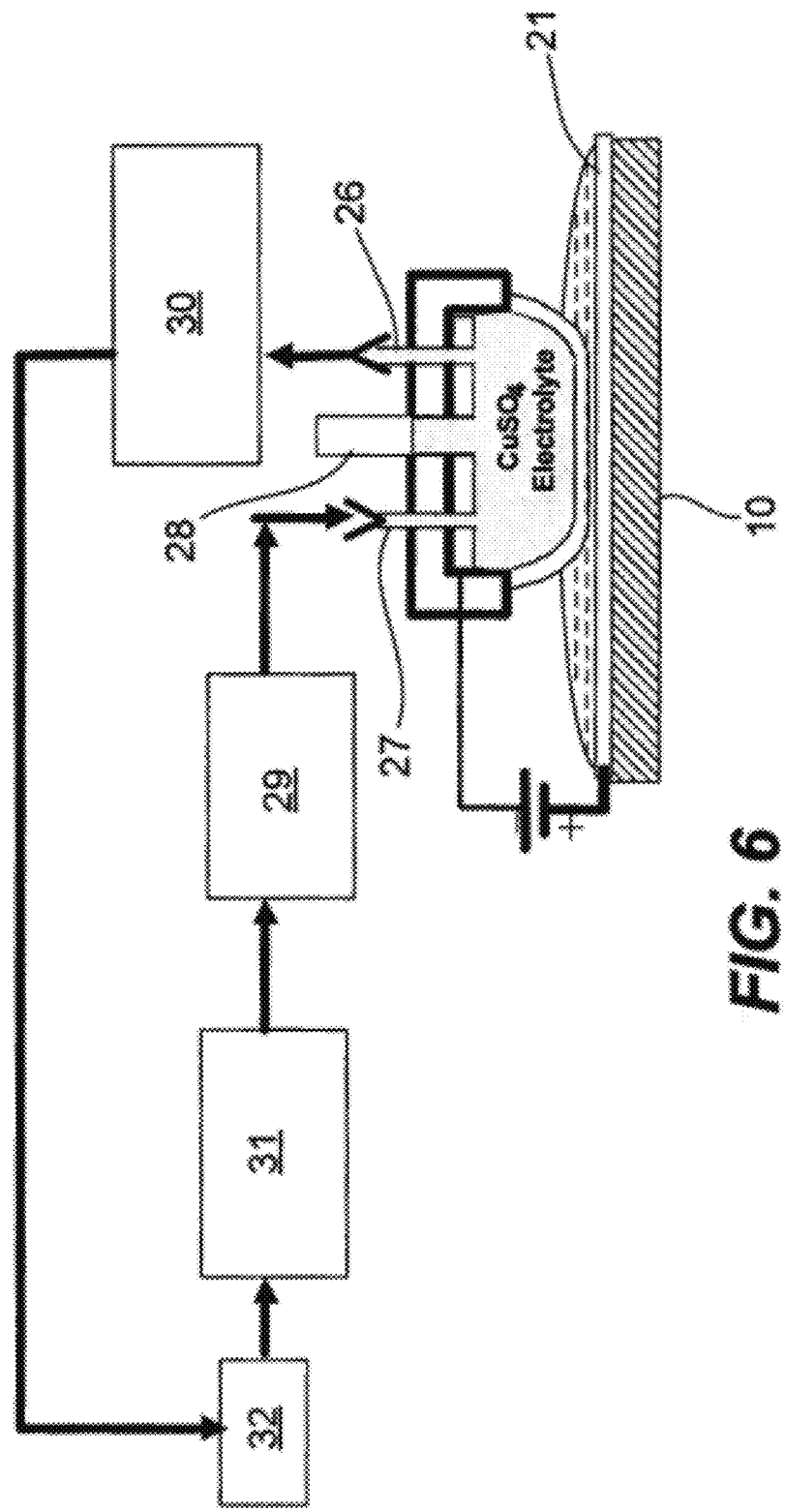
FIG. 6 is a diagram of an EFIE provided with a pressure relieving/adjusting system for the internal electrolyte and PFI.

In another embodiment, the proximity-focusing element is an ionic conductor membrane, preferably an anion conducting membrane, exemplified in FIG. 5. The methods and processes using an ionic conducting membrane 20b are referred to herein as Selective Membrane Mediated Accelerator Removal Technology (SMMART). It has the advantage over the use of electronically conductive metal PFIs (20a) in that intermittent or stray physical contact of the membrane does not cause electrical shorting of the current to the workpiece, but the disadvantage that physical contact is more likely to lead to abrasion of the membrane, leaving a debris on the wafer. The front surface of the membrane (closest to the substrate) acts as a virtual counter electrode proximity focusing interface 14. Though it is believed that a faradaic process does not occur there, the potential is maintained at a nearly constant value and the interface can be brought very close to the surface. Metal deposition and gas evolution are avoided by having the auxiliary counter electrode spatially removed from the interface, and hence can be constructed as to not interfere with the operation. Longevity of the operation without maintenance can therefore be achieved. Therefore, the ionic conductor is chosen so it does not conduct electricity and faradaic reduction processes do not occur on its interface. A counter electrode 24 then resides in a chamber 23 on the opposite side of the ion conductor from the workpiece. The chamber 23 is formed by the membrane 20b and the upper and side walls of the EFIE. A high conductivity electrolytic solution resides in chamber 23 on the counter electrode side of the assembly. The conductivity of this electrolyte is typically at least 100, more typically 10,000, times more conductive than the electric field supporting electrolyte 22 (EFSE). Examples of suitable electrolytes are water-based solutions containing substantial concentrations of acids, bases, and inorganic or organic salts (e.g. >2%/wt solutions). The function of the electrolyte is to carry the ionic current from the ionic membrane to the counter electrode. An electrolyte fill inlet 27 and outlet 26 are provided to allow electrolyte to circulate within, and to fill and empty, chamber 23. Referring to FIG. 6, the inlet and outlet 27, 26 may be connected to a closed system for relieving and adjusting the pressure exerted by the foil or membrane 20 on the workpiece metal surface 21. The system comprises a ballast chamber 28 useful in quickly adjusting the internal pressure of the membrane chamber 23 and an appropriate valved flow meter 30, pressure sensor 29, pump 31 and reservoir 32. The ballast vessel 28 will typically at least partially contain a gas to accommodate expansion, or alternatively, is open to the atmosphere, and allows fluid to rapidly move in and out of the chamber without substantial changes in inter-chamber pressure. The system may be adjusted to maintain a predetermined constant force at the membrane-workpiece interface so that an optimum field is maintained without exerting undue force to possibly damage the membrane or workpiece surface topography or impede its progress across the workpiece The power supply electrical leads, 25a and 25b (FIG. 5), respectively, are connected to the counter electrode 24 and the workpiece metal surface 21. In an embodiment, the proximity focusing element is composed of a cationic conducting film held at its periphery and is an "inflatable membrane" similar to that discussed for the metal foil membrane above. A particular example of a useful cationic membrane material is Nafion™, manufactured by Dupont. During SMMART anodic workpiece-polarized operations, positive charged species generated at the workpiece (e.g. protons, metal ions from workpiece metal, positive charged ionic forms of the accelerator detached from the surface) migrate to the membrane interface and through the membrane. Charge balance requires that an equivalent faradaic reaction occur at the counter electrode, housed in the EFIE electrolyte chamber. For example, if the highly conductive solution contains metal ions and acid, hydrogen gas and/or metal plating would be expected at the counter electrode. In the case of cathodically workpiece-polarized SMMART operations, the counter electrode is preferably a noble or dimensionally stable electrode (e.g. Pt, Ta, Au) and the high conductivity electrolyte should be substantially devoid of any metal ions (e.g. a high purity acid solution). In this case, the particular accelerator must be operable to be removed from the surface by a reduction process. If the reduced accelerator species is neutral, then it is removed by being dissolved in the flowing electric field supporting electrolyte. If the reduced accelerator species created by a cathodic SMMART process is negatively charged, an anionic conductive membrane would be preferred.

Apparatus

Figure 13:
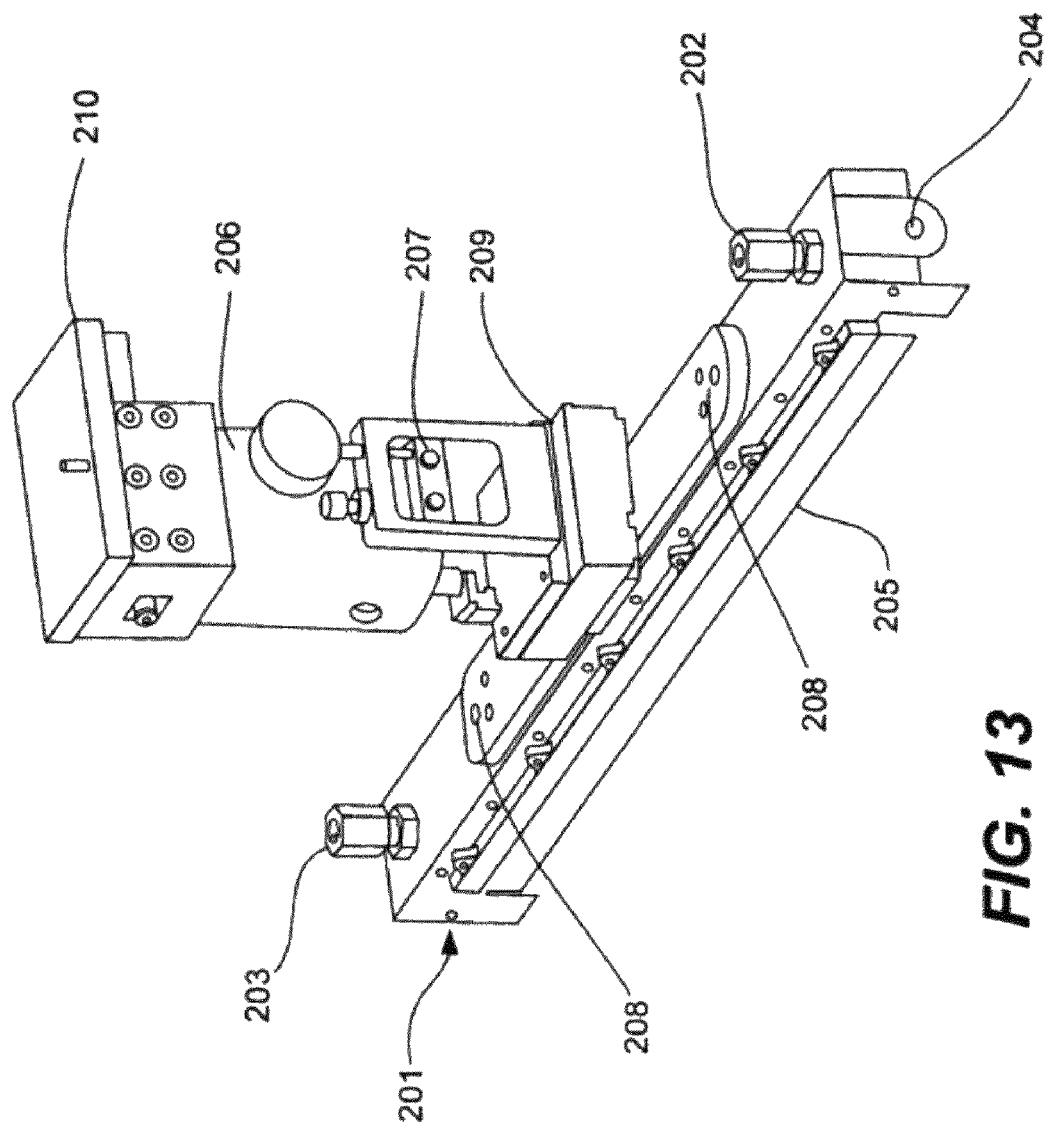
FIG. 13 is a 3D view of a scanning bar head with lifting apparatus.
Figure 14:
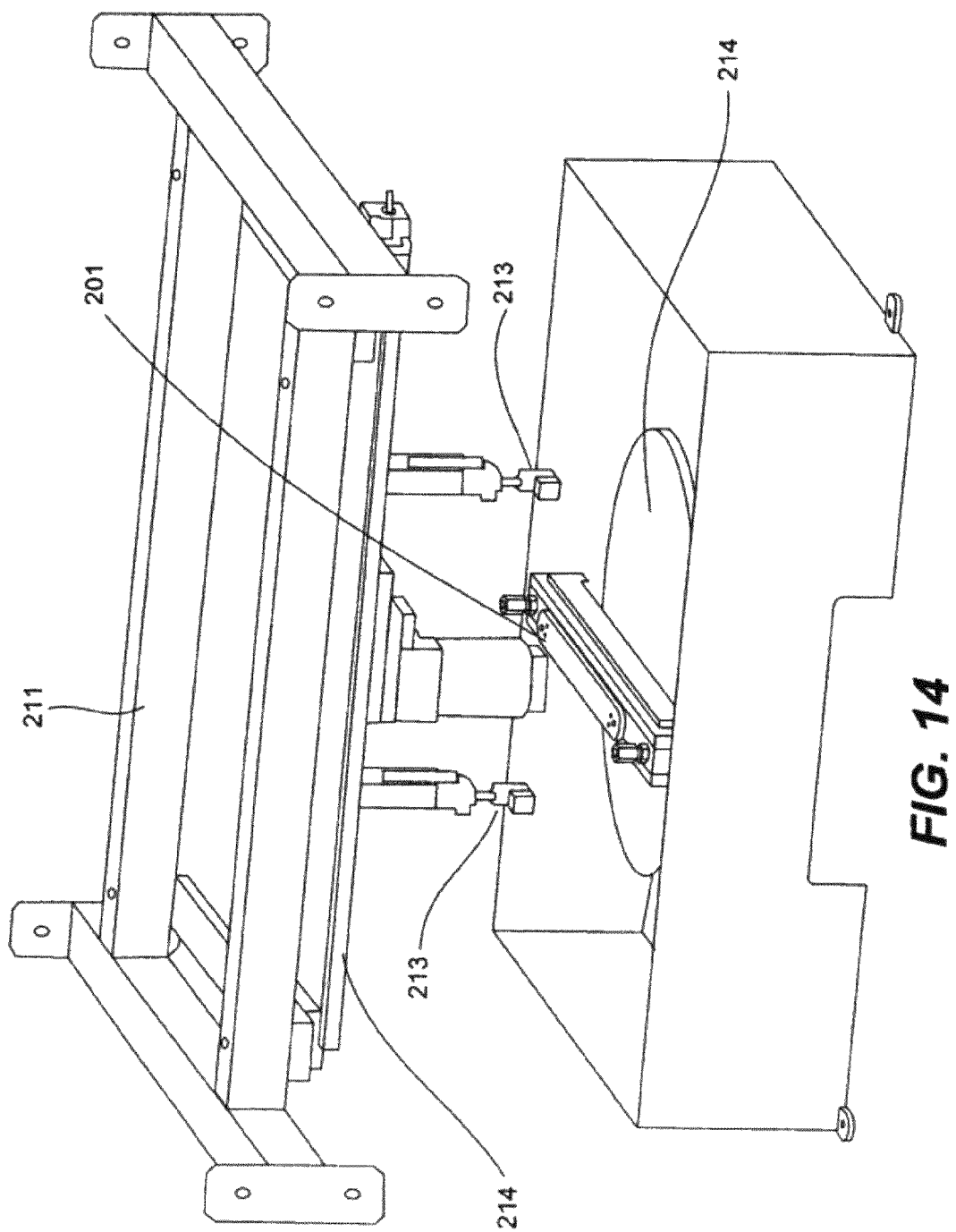
FIG. 14 is a 3D view of a device of FIG. 13 mounted for scanning a wafer.

FIGS. 13 and 14 show a preferred configuration of the SEAR/SMMART apparatus useful for performing linear sweeps or scans over a wafer surface. A linear scanning bar head assembly 201 containing an electrolyte inlet 202 and outlet port 203, a counter electrode connection terminal 204, and proximity focusing interface 205 (for example, a inflated and supported Nafion membrane) can be swept over a wafer (not shown) in a linear sweeping motion. The head assembly can be lifted and dropped via a pneumatic cylinder 206 which can be used to control the applied down force between the membrane/wafer interface, or drive the head assembly to a metered hard stop position using a gap thickness control adjusting assembly 207. The front to back alignment of the head to the wafer and the angle of attack or camber of the head is adjusted by camber and alignment adjusting screws 208. A six axis force and torque sensitive load cell 209 is used to monitor the alignment and frictional forces during processing. The head assembly is mounted to a position controlled motorized linear slide mechanism 210 which is held to the equipment using a gantry 211 having a linear motor-driven slide 214. A vacuum chuck 212 allows the placement and flat mounting of the wafer below the scanning head, and can be rotated during or between linear scans of the head, for spray application of etchant, accelerator, rinse water, or other desirable components. Above the head located azimuthally off axis from the direction of mechanical sweep of the head are two or more electrical contacts 213 that can be articulated. The electrical contact makes electrical contract to one end of the wafer periphery while the scanning bar assembly 201 is passing over the other end of the wafer. After passing though approximately the wafer center, one of the contacts is raised to allow the head to base under it slightly after the other contact is lowered. In this way, continuous electrical contact is maintained with the wafer throughout the wafer scan.

The apparatus described in this section has certain inherent advantages. Among these is the fact that all the various operations described herein and laid out in FIG. 8 can be performed within this single station or module, thereby increasing the throughput and eliminating the time needed to move the workpiece between various station designed to perform a sub-set of these processes. The workpiece can first be processed to remove neck metal of high aspect ratio features in the apparatus using a high resistance electrolyte, a cationic membrane, and the scanning bar over the wafer.

Prior to, or after removing neck metal, one may apply a cleaning etch, perform various rinsing steps, and apply the accelerator (e.g. each using a spray nozzle), Then (if not performed concurrently with neck opening) the accelerator can be selectively removed from the field and upper regions of high aspect ratio features by anodically polarizing the surface and passing a cationic membrane over the surface in a sweeping motion and performing SMMART, with deionized water as the EFSE. In any of the bar head sweeping operation, multiple passes or sweeps can be made, with rotation of the wafer between sweeps. This approach is found to improve the uniformity of the processes and the removal/deposition operation. Afterward, one can fill features in the same apparatus by changing the electrolyte that resides between the heads PFI (the cationic membrane in this example) from water to a high conductivity metal-ion-containing electrolyte containing appropriate plating additives. The polarity of the head is reversed (the workpiece is now made cathodic), resulting in preferential deposition of metal into high aspect ratio features. Because low aspect ratio feature may not be selectively accelerated or filled at this point, the sequence can continue by rinsing off high conductivity electrolyte form the surface, performing or repeating the steps of cleaning, etching the surface, removing oxides, rinsing, and globally applying accelerant (again, performed, for example, by spraying the surface with the appropriate solutions). Then, one can repeat anodic selective accelerator removal (e.g. using deionized wafer as the EFSE) to create a high concentration of accelerator inside low aspect ratio feature and removing accelerator selectively from the exposed or raised field. The conditions for performing this selective accelerator removal may be different than that of the prior, high aspect ratio filling operation. Finally, a high conductivity metal plating electrolyte with appropriate additives can be applied to the surface between the cationic membrane and the workpiece, the workpiece cathodically polarized, and the bar head scanned over the surface, thereby plating metal preferentially into low aspect ratio features. The wafer can then have excess overburden metal removed using a metal etch chemistry. As one can see, a large number of operations are thereby accomplishing, all one station/module, ultimately creating a wafer with metal filled features having a vast range of widths, and very little metal if any metal left in undesirable area's (e.g. the field).

Post SEAR Feature Filling

As mentioned above, after performing SEAR, metal deposition (e.g. electrodeposition) can be performed preferentially in the recessed regions of the workpiece surface. In a particular example of this, MPSA is sprayed from a solution onto a workpiece. The workpiece is then rinsed to remove residual accelerant from the surface, and then SEAR is performed (e.g. by SMMART). Next, the workpiece is electroplated using a plating solution containing metal ions and an appropriate suppressor for MPSA (e.g. polyethylene oxide or polyethylene glycol or co-polymers of these, with ppm concentrations of chloride ion). Some additional acid is also often used to enhance the conductivity of the electrolyte. Plating cathodic current is applied to the workpiece and the recessed features are filled with metal preferentially (i.e. bottom up filling). In one embodiment of the invention, the filling of the features continues to a point where the amount of metal in the features is sufficient for the high and low aspect ratio recessed features to be completely filled, and then is continued to create an embossed structure (raised or protruded metal above the thickness of the field) over all recessed features. This is a unique capability of this process that enables protruded metal to be deposited over low aspect ratio features, and it has been found that it can be highly advantageous when properly controlled. After plating, the workpiece is rinsed of residual plating solution and dried (e.g. in a spin rinse dryer). In some embodiments the workpiece is then annealed (200-450° C., 0.5 to 30 minutes). Removal of metal from the surface is then performed. However, because of the reduced topography and raised (protruded or embossed) structures enabled by SEAR, removal techniques other than costly CMP or eCMP can be performed. For example, an isotropic wet etch, electropolish or membrane-mediated electropolish can be performed. The process is typically terminated when the metal in the field clears. If excess filling (embossing) of metal over the features was performed during the SEAR and plating processes, the first point that all metal clears to the dielectric plane occurs at regions devoid of recessed features, but metal remains over all the features. In classical process flows, metal clears first at low aspect ratio features and around their periphery. Hence, the embossing can "protect" damascene features and changes the order of clearing typically seen in classical process flows (e.g standard electroplating and CMP) improving the final topography and yield significantly.

Figure 7:
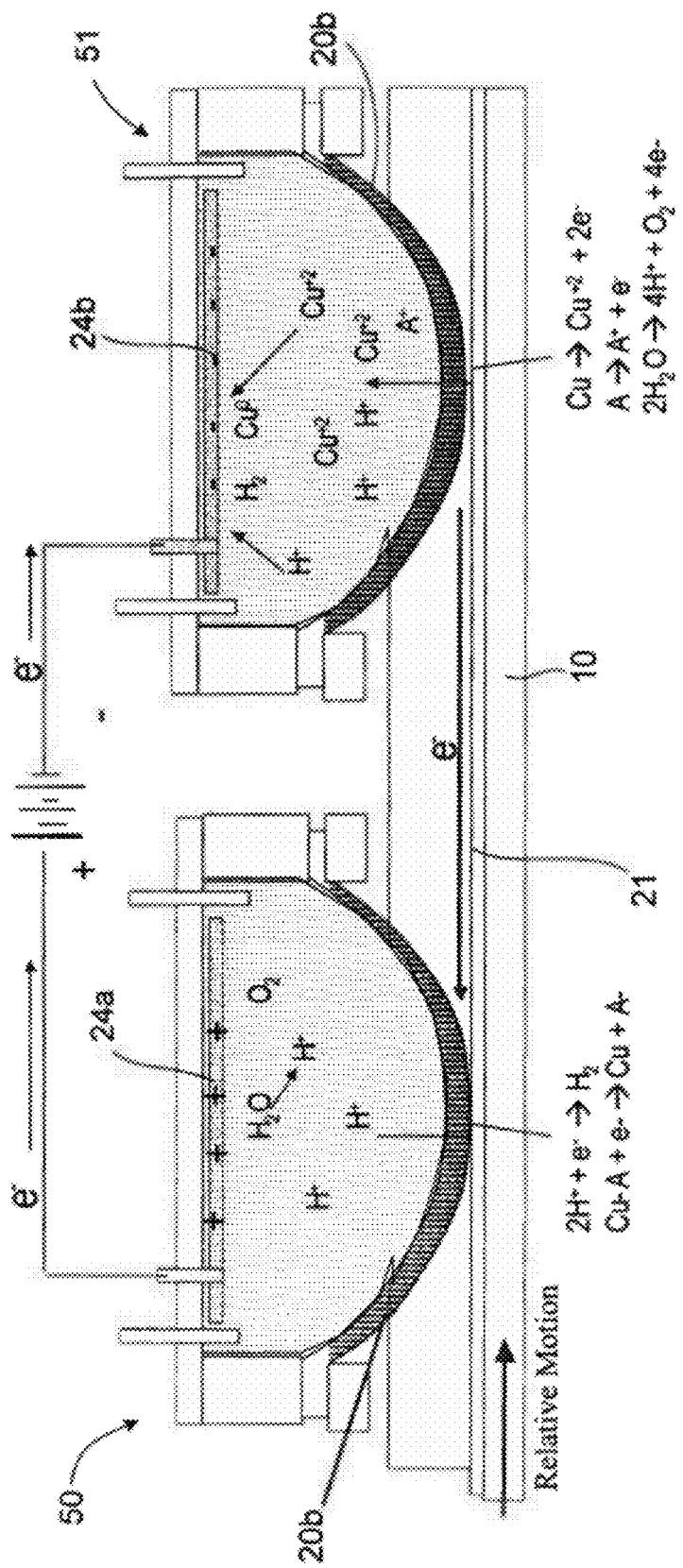
FIG. 7 is a diagram showing the combined use of an anodic and cathodic EFIE according to the invention.

While in many cases application of current to the workpiece is made by physically contacting the surface metal with a metallic lead at the periphery (a contact connecting it to the power supply), an alternative, "indirect" or electrochemical contacting method may also be used. An example of use of an indirect contacting method is described in U.S. Pat. No. 6,143,155. Referring to FIG. 7, two or more SMMART EFIE's can be used simultaneously to supply indirect current to the surface. One EFIE 50 will be anodically polarized with respect to the workpiece and accommodate an anode 24a. Another EFIE 51 will be cathodically polarized with respect to the workpiece and accommodate a cathode 24b. Oxidative and reductive faradaic reactions then occur under the PFIs 20b at the workpiece surface 21, generating or consuming electrons. Electrons (electrical current) then passes though the workpiece to the opposite SMMART EFIE.

Figure 8:
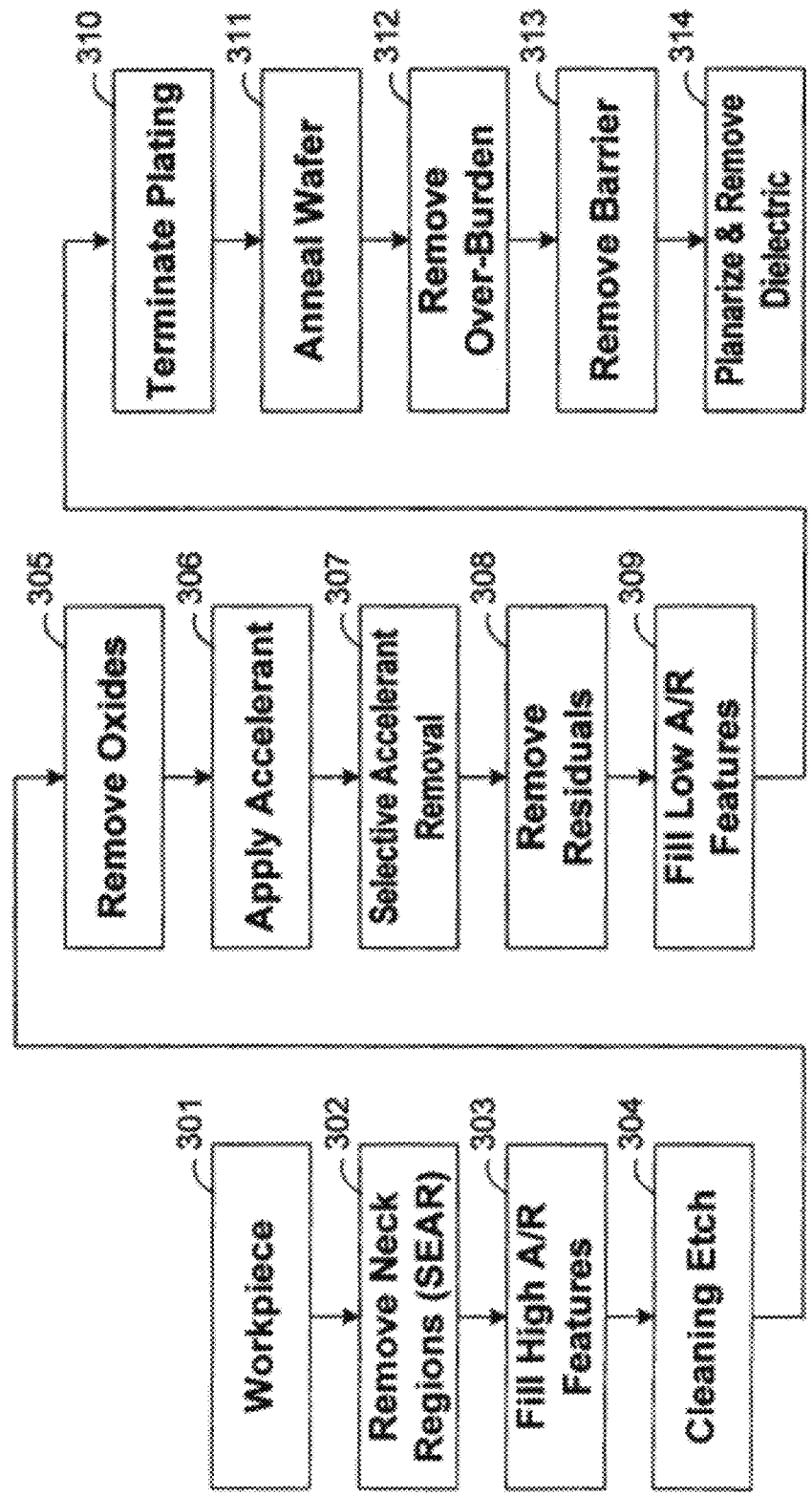
FIG. 8 is a process flow diagram for filling high and how A/R features using SEAR according to the invention.

In a particular preferred apparatus embodiment, the operations of applying accelerator, rinsing the wafer, SEAR (e.g. SMMART), feature filling and metal removal are combined on one piece of hardware. Referring to FIG. 8, a workpiece such as a wafer is provided 301, typically oriented face up and held on a chuck (e.g. a vacuum chuck). At this point SEAR may be used in a step 302 to accomplish, as previously described, simultaneous reduction or removal of any metal neck regions, usually present around high A/R features, and to prepare the surface for high A/R filling. However, this step may be optionally omitted and the high A/R features may be filled in step 303 without preparation by SEAR.

After filling the high A/R features, the surface of the wafer is optional cleaned in step 304 with a cleaning solution to remove any contaminants from the filling step, such as surface residual accelerator or leveler. For this purpose an etchant is preferred that oxidizes a portion of the metal to a metal oxide (e.g., copper oxide). This step is typically followed by or is performed simultaneously with a step of removal of the metal oxide 305 from the surface of the substrate using a metal oxide complexing or etching agent. For step 305 any suitable oxidizing agent capable of forming copper oxide may be used, however, it is generally preferred that a self-limiting oxidation process be used. That is, the oxidation of the copper occurs slowly and controllably. Exemplary oxidizing agents include, for example, dilute aqueous solutions of peroxides (such as hydrogen peroxide), persulfates, ozone and/or permanganates. In some embodiments, the oxidizing solution has a relatively high pH, e.g., at least about 5. In more specific cases, the solution has a pH of between about 5 and 12, and in even more specific cases, between about 6 and 10. To control the oxidizing solution pH, a neutralizing agent may be used, preferably one with an anion that does not complex with copper ions. Examples include tetra-alkyl ammonium and alkali metal salts of hydroxides. The oxidizing etch solution may also contain a complexing agent that complexes with the copper to control the etching rate of the acid, and/or a surfactant to further modulate the etch rate.

Once copper oxide is formed by the oxidizing solution, it can be removed by using any suitable copper oxide etchant in step 305. In some embodiments the copper oxide etchant selectively removes copper oxide without substantially attacking the copper crystallites or grain boundaries. Suitable copper oxide etchants include dilute acids and acids with high pKa values, EDTA, ammonia, glycine and various copper complexing agents, for example. Exemplary acids include dissociated inorganic acids such as phosphoric acid, sulfuric acid and organic acids such as acetic acid. Appropriate pH for the etching solution is typically in the range of about 0 and 2. Suitable complexing agents may include ethylenediamine tetraacetic acid (EDTA), glycine, citric acid and salts thereof, maleic acid and salts thereof, and certain ammonium compounds known to those of skill in the art, for example. In some embodiments, separate oxidizing and oxide etching solutions are employed. In other embodiments, a single solution is used for both oxidizing copper and removing copper oxide. By controlling the ratio of copper oxidizing agent and copper oxide etchant in such solutions, one can control the amount of oxidation and depth of the intermediate copper oxide film that is formed on the surface of the substrate. Preferred etching solutions are described in the US patent application by Koos et. al. In a preferred embodiment, the solution includes between about 0.05% and 15% glycine (or copper complexing agent) by weight and between about 0.5% and 20% peroxide (e.g., $H_2O_2$) by weight. In a specific embodiment, for example, an etching solution containing about 1% (by weight) glycine and about 3% (by weight) $H_2O_2$ is used. Preferably, the single solution includes a buffering agent that maintains the pH at a specific value. Buffering agents such as acetate, carbonate, or phosphate can be selected depending on the desired pH value. More specifically, the solution may have a pH of between about 5 and 12, and in even more specific cases, between about 6 and 10. Alternatively, the natural buffering characteristic of the glycine (pH around 9). The pH can be adjusted by the addition of an appropriate agent such as an alkali metal or tetra-alkyl ammonium hydroxide.

The etching and/or oxidizing solution may additionally contain a corrosion inhibitor to minimize grain attacks and surface roughening of the exposed copper metal. Suitable corrosion inhibitors include, but are not limited to, benotriazole (BTA), thiourea, certain mercaptans, and imidazoles. Note that in addition to or instead of adding corrosion inhibitor to the etching solution, the substrate surface may be treated with a solution containing corrosion inhibitor prior to etching.

After these pre-SEAR cleaning steps, the wafer is typically sprayed in step 306 with a solution containing accelerant. Next the wafer is usually rinsed (e.g. with water). Next accelerant is selectively removed in step 307 by electrochemical action by use of SEAR (e.g. using a SMMART removal head and process). Then the wafer is optionally cleaned again in step 308 to remove any residuals particles, for example, by random abrasion with the membrane. The cleaning solution, in this instance preferably are relatively strong, low pH acids such as HCl, HF or sulfuric acid. A solution of 5%-100% sulfuric acid is useful. A commercial cleaning agent from EKC under the trade name CMP-5500 is also useful for this purpose. Mechanical or ultra- or megasonic agitation can also be used to aid in the cleaning and particle removal process.

The wafer is then plated to fill low A/R features in step 309, using a bath primarily containing metal ions and a suppressor, as described above. A conventional immersion-bath wafer plating apparatus, a thin film microplater, or a scanning proximity focusing plating head can be employed. During the plating the wafer becomes wetted with electrolyte primarily containing metal ions and a suppressing compound, with other elements as optional as described above. If the operations of SEAR are to be repeated, rinsing to remove the plating electrolyte should be performed, optionally the surface should be etched and cleaned, and accelerator reapplied as above. Upon termination of filling 310 the features, the surface may be annealed in step 311, using, for example, hot reducing gas and/or IR heating. An inert atmosphere "dome" containing reducing gas may be placed over the wafer, and annealing can be performed without moving the wafer from the processing module. After optionally annealing the workpiece, overburden metal can also be removed 312 in this same module by a wet etching process, as described in, for example, Controlini and Mayer, or Koos et. al. Alternatively, metal can be removed using a scanning membrane mediated electropolishing head, as described by Mazur. Then according to conventional wafer processes the barrier layer may be removed in step 313 and planarization processes 314 may be applied. Alternatively, the barrier can be removed using a barrier selective wet etch, such as a hot alkaline solution to remove W, Ti, TiN, Ta, or TaN from a surface with embedded copper. For example, a 30%/wt solution of potassium hydroxide at 80° C. will remove these barrier materials and leave copper within the damascene trenches. As can be seen by this process flow, a number of processes that previously required a number of separate stations can now be combined into one module/station, substantially increasing productivity.

The following example is presented only for illustrative purposes and is not intended to limit the scope of the invention in any way.

EXAMPLE

The procedure to achieve these results is now described, but we are not implying that this is the only procedure or the optimal procedure. A 200 mm wafer was first sprayed with deionized wafer to wet the surface for 3 seconds, then sprayed with a 5% solution of sulfuric acid for 5 seconds to remove a surface oxide, followed by rinsing with a spray of DI water to remove the acid, followed by spraying with a solution containing 1 g/L MPSA in water for 10 seconds to uniformly accelerated the wafer. The wafer was then rinsed completely with water and then dried in air by spinning the wafer at 1500 rpm at about 20 C$^o$. (Despite rinsing and drying, the accelerant still remains attached to the surface). Next a SMMART EFIE head was passed over the surface at 50 cm/sec. The velocity was maintained constant by varying the rotation rate as a function of radial position of the head. Pure deionized water was used as an electric field supporting electrolyte. An approximately one molar solution of sulfuric acid was contained in the counter electrode chamber (i.e. used as the high conductivity electrolyte). A Nafion™ cationic membrane was used as the proximity focusing elements. The voltage between the counter electrode inside the EFIE assembly and the wafer surface potential was 9 volts vs. the counter electrode, and was pulsed at a cycle of 1 ms on, and for 4 ms off. The SMMART head was scanned over the surface once, covering about 65% of the total wafer surface (from a radius of about 1 cm to 8 cm from the center, surface area processed about 200 cm$^2$). The approximate surface area of exposure between the SMMART membrane and the wafer surface at any instant in time was about 3 cm$^2$ (as determined by the region of metal removal in a separate experiment). The total charge passed during the process was approximately 10 C. Based on mass difference measurement, approximately 50% of this charge (5 C) was associated with the removal of copper originally at the surface. The average thickness of metal removed is estimated to be less than 90 Å without any attempt to optimize the operating conditions to achieve uniform removal, such as maintaining the head over a particular region of the wafer for the same length of time. It is believed that the balance of charge (5 C) was used in oxidizing water and the accelerator. After removal of the accelerator, the wafer was plated in a plating bath containing 18 g/L copper ion, 180 g/L sulfuric acid, 50 ppm chloride ion, and 1000 ppm L-62 PEO suppressor. A constant plating current of 5 amps was applied for 60 seconds. The relative rate of plating in the recessed feature regions (widths ranging from 5 to 100 um wide and 0.5 um deep) was about 8 times greater than in the field areas where the accelerator had been preferentially removed.

Those skilled in the art may make numerous uses and modifications of the specific embodiments described, without departing from the inventive concepts. The steps recited may, in some instances, be performed in a different order; or equivalent structures and processes may be substituted for the described structures and processes. The invention is to be construed as encompassing every novel feature and novel combination of features present in or inherent to the methods and structures described in the following claims and their equivalents.

What is claimed is:
1. A method of metal deposition, comprising:
 (a) providing a work piece including field regions and recessed features;
 (b) causing a deposition accelerator to become selectively attached to surfaces of the recessed features, including:
   (i) causing the deposition accelerator to become attached to the field regions and the surfaces of the recessed features; and
   (ii) selectively removing the deposition accelerator from the field regions with at least an electrochemical process that is performed without performing substantial metal deposition on the field regions and surfaces of the recessed features, including bringing the work piece into close proximity with an electric field-imposing member such that the accelerator is selectively removed from the field regions in close proximity with the member and that accelerator more remote from the member on the surfaces of the recessed features remains attached; and
 (c) after (b) is at least partially complete, depositing a metal onto the field regions and the surfaces of the recessed features, wherein the deposition accelerator remaining attached to the surfaces of the recessed features increases the rate of metal deposition onto the surfaces of the recessed features relative to the rate of metal deposition onto the field regions, and wherein the depositing the metal continues until the recessed features are filled and the metal is protruding in regions of the recessed features relative to the field regions.

2. The method of claim 1, wherein (b) is performed without substantial contact between the work piece and the member.

3. The method of claim 1, wherein close proximity includes contact between the work piece and the member.

4. The method of claim 1, wherein the member includes a flat electrode.

5. The method of claim 1 wherein the member is separated from the work piece by a film of electrolyte solution.

6. The method of claim 1, wherein the deposition accelerator is an electroplating accelerator.

7. The method of claim 1, further comprising:
prior to (b), plating the metal onto the field regions and the surfaces of the recessed features to fill at least some of the recessed features.

8. The method of claim 7, further comprising:
prior to (b), exposing the metal plated field regions and surfaces of the recessed features to an etching solution to remove contaminants and/or debris.

9. The method of claim 1, further comprising:
prior to (b), plating the metal onto the field regions and the surfaces of the recessed features to fill at least some of the recessed features; and
prior to (b), exposing the metal plated field regions and surfaces of the recessed features to an oxide-removing solution.

10. The method of claim 1, wherein the recessed features include low aspect ratio features and high aspect ratio features.

11. The method of claim 1, wherein at least some of the recessed features have an aspect ratio of less than one.

12. The method of claim 1, wherein the metal is copper.

13. The method of claim 1, wherein the deposition accelerator is selected from the group consisting of 2-mercaptoethane-sulfonic acid (MESA), 3-mercapto-2-propane sulfonic acid (MPSA), dimercaptoproionylsulfonic acid (DMPSA), dimercaptoethane sulfonic acid (DMESA), 3-mercaptopropionic acid, mercaptopyruvate, 3-mercapto-2-butanol, and 1-thioglycerol.

14. The method of claim 1, wherein the work piece is a partially fabricated integrated circuit.

15. The method of claim 1, wherein the recessed features include trenches and/or vias.

* * * * *